(12) United States Patent
Kurata et al.

(10) Patent No.: US 8,680,542 B2
(45) Date of Patent: Mar. 25, 2014

(54) ORGANIC LIGHT-EMITTING ELEMENT, ORGANIC LIGHT-EMITTING DEVICE, ORGANIC DISPLAY PANEL, ORGANIC DISPLAY DEVICE, AND METHOD OF MANUFACTURING AN ORGANIC LIGHT-EMITTING ELEMENT

(75) Inventors: Keiko Kurata, Hyogo (JP); Noriyuki Matsusue, Osaka (JP); Kazuhiro Yoneda, Osaka (JP)

(73) Assignee: Panasonic Corporation, Osaka (JP)

( * ) Notice: Subject to any disclaimer, the term of this patent is extended or adjusted under 35 U.S.C. 154(b) by 127 days.

(21) Appl. No.: 13/287,526

(22) Filed: Nov. 2, 2011

(65) Prior Publication Data
US 2012/0104423 A1 May 3, 2012

Related U.S. Application Data

(63) Continuation of application No. PCT/JP2010/005028, filed on Aug. 10, 2010.

(51) Int. Cl.
*H01L 51/52* (2006.01)
*H01L 27/32* (2006.01)

(52) U.S. Cl.
USPC .......... 257/88; 257/98; 257/40; 257/E51.018; 257/E27.119; 438/29; 438/22; 438/24; 438/82; 438/46

(58) Field of Classification Search
CPC .............. H01L 29/0673; H01L 29/772; H01L 29/0665; H01L 33/32; H01L 31/173
USPC .......... 257/13, 40, 88, 98, E51.018, E27.119; 438/29, 22, 82, 99, 24, 46, 47
See application file for complete search history.

(56) References Cited

U.S. PATENT DOCUMENTS

| 5,443,922 | A | 8/1995 | Nishizaki et al. | |
|---|---|---|---|---|
| 2003/0143319 | A1* | 7/2003 | Park et al. | 427/64 |
| 2006/0124920 | A1 | 6/2006 | Kimura | |
| 2007/0029539 | A1* | 2/2007 | Yashima et al. | 257/13 |

(Continued)

FOREIGN PATENT DOCUMENTS

| JP | 05-163488 | 6/1993 |
|---|---|---|
| JP | 2003-272855 | 9/2003 |
| JP | 2007-066883 | 3/2007 |
| JP | 2007-123065 | 5/2007 |
| JP | 2008-059791 | 3/2008 |

(Continued)

OTHER PUBLICATIONS

International Search Report in PCT/JP2010/005028, dated Nov. 2, 2010.

*Primary Examiner* — Thinh T Nguyen
(74) *Attorney, Agent, or Firm* — Greenblum & Bernstein, P.L.C.

(57) ABSTRACT

An organic light-emitting element includes a reflective anode, a first functional layer, an organic light-emitting layer that emits blue light, a second functional layer, a transparent cathode, and a coating layer. An optical thickness of the first functional layer is greater than 0 nm but not greater than 316 nm. A difference in refractive index between the transparent cathode and either a layer adjacent to the transparent cathode within the second functional layer or a layer adjacent to the transparent cathode within the coating layer is from 0.1 to 0.7 inclusive. The transparent cathode has a physical thickness greater than 0 nm but not greater than 70 nm, a refractive index from 2.0 to 2.4 inclusive, and an optical thickness greater than 0 nm but not greater than 168 nm.

29 Claims, 19 Drawing Sheets

(56) References Cited

U.S. PATENT DOCUMENTS

| | | | |
|---|---|---|---|
| 2007/0182319 A1* | 8/2007 | Wei et al. | 313/506 |
| 2008/0054797 A1 | 3/2008 | Furugori | |
| 2009/0079336 A1 | 3/2009 | Yamada et al. | |
| 2010/0320446 A1 | 12/2010 | Kang et al. | |
| 2011/0254437 A1 | 10/2011 | Yamada et al. | |

FOREIGN PATENT DOCUMENTS

| | | |
|---|---|---|
| JP | 2009-049135 | 3/2009 |
| JP | 2010-518557 | 5/2010 |

* cited by examiner

FIG. 6

| | Refractive index (n) | | |
|---|---|---|---|
| | min | ave | max |
| Resin passivation layer | 1.3 | 1.5 | 1.7 |
| Thin-film passivation layer | 1.7 | 1.9 | 2.1 |
| Transparent cathode | 2.0 | 2.2 | 2.4 |
| Electron transport layer | 1.7 | 1.9 | 2.1 |
| Light-emitting layer (Blue) | 1.6 | 1.8 | 2.0 |
| Hole transport layer | 1.5 | 1.7 | 1.9 |
| Hole injection layer | 1.8 | 2.0 | 2.2 |
| Transparent conductive layer | 1.9 | 2.1 | 2.3 |
| Reflective anode | 0.12 | 0.14 | 0.19 |

| | Extinction coefficient (k) | | |
|---|---|---|---|
| | min | ave | max |
| Resin passivation layer | 0.00 | 0.00 | 0.00 |
| Thin-film passivation layer | 0.00 | 0.011 | 0.08 |
| Transparent cathode | 0.00 | 0.15 | 0.55 |
| Electron transport layer | 0.10 | 0.18 | 0.30 |
| Light-emitting layer (Blue) | 0.00 | 0.15 | 0.62 |
| Hole transport layer | 0.13 | 0.15 | 0.17 |
| Hole injection layer | 0 | 0.17 | 0.91 |
| Transparent conductive layer | 0 | 0.19 | 0.60 |
| Reflective anode | 1.52 | 2.9 | 5.3 |

| | Film thickness in nm | | | | | |
|---|---|---|---|---|---|---|
| | min | | ave | | max | |
| Resin passivation layer | 5400 | | 6000 | | 6600 | |
| Thin-film passivation layer | 558 | | 620 | | 682 | |
| Transparent cathode | 31.5 | | 35 | | 38.5 | |
| Electron transport layer | 31.5 | | 35 | | 38.5 | |
| Light-emitting layer (Blue) | 36 | | 40 | | 44 | |
| Hole transport layer | 9 | | 10 | | 11 | |
| Hole injection layer | 4.5 | 27.9 | 5 | 31 | 5.5 | 34.1 |
| Transparent conductive layer | 14.4 | | 16 | | 17.6 | |
| Reflective anode | 135 | | 150 | | 165 | |

| | Optical film thickness in nm | | | | | |
|---|---|---|---|---|---|---|
| | min | | ave | | max | |
| Resin passivation layer | 7020 | | 9000 | | 11220 | |
| Thin-film passivation layer | 949 | | 1178 | | 1432 | |
| Transparent cathode | 63 | | 77 | | 92.4 | |
| Electron transport layer | 53.6 | | 66.5 | | 80.9 | |
| Light-emitting layer (Blue) | 57.6 | | 72 | | 88 | |
| Hole transport layer | 13.5 | | 17 | | 20.9 | |
| Hole injection layer | 8.1 | 49.0 | 10 | 60.6 | 12.1 | 73.5 |
| Transparent conductive layer | 27.4 | | 33.6 | | 40.5 | |
| Reflective anode | | | | | | |

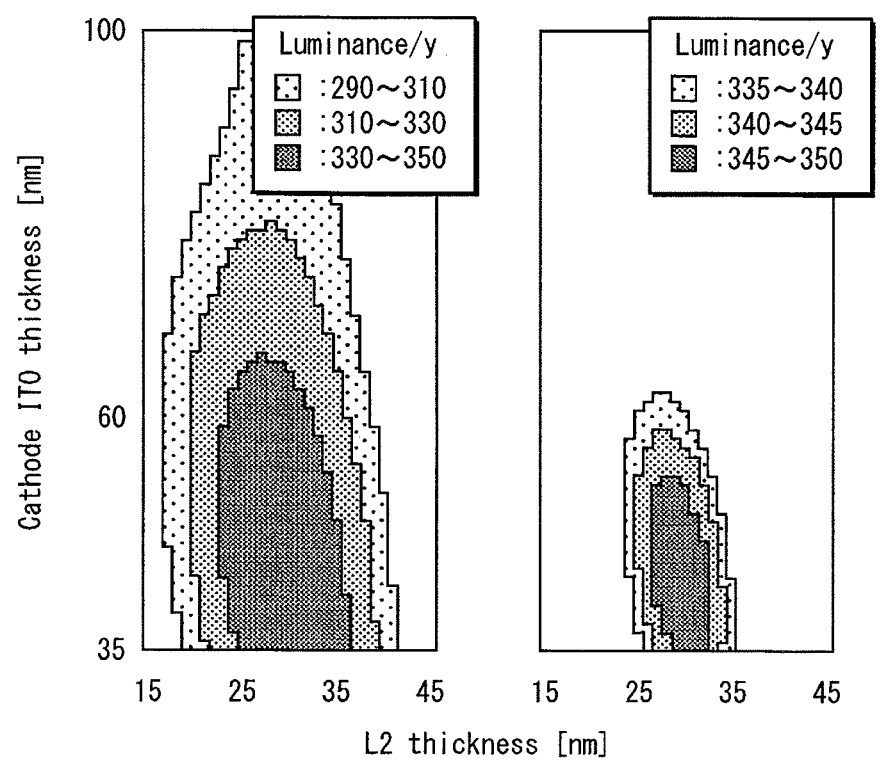

FIG. 10

|  | Cathode ITO 100 nm | | | Cathode ITO 35 nm | | | UP (%) |
|---|---|---|---|---|---|---|---|
|  | Efficiency (cd/A) | x | y | Efficiency (cd/A) | x | y |  |
| Red | 12.6 | 0.67 | 0.33 | 10.3 | 0.67 | 0.33 | 82 |
| Green | 40.4 | 0.29 | 0.65 | 45.2 | 0.29 | 0.66 | 112 |
| Blue | 1.3 | 0.13 | 0.07 | 2.2 | 0.13 | 0.08 | 165 |

FIG. 11

| | Refractive index (n) | | |
|---|---|---|---|
| | min | ave | max |
| Resin passivation layer | 1.3 | 1.5 | 1.7 |
| Thin-film passivation layer | 1.7 | 1.9 | 2.1 |
| Transparent cathode | 2.0 | 2.2 | 2.4 |
| Electron transport layer | 1.7 | 1.9 | 2.1 |
| Light-emitting layer (Blue) | 1.6 | 1.8 | 2.0 |
| Hole transport layer | 1.5 | 1.7 | 1.9 |
| Hole injection layer | 1.8 | 2.0 | 2.2 |
| Transparent conductive layer | 1.9 | 2.1 | 2.3 |
| Reflective anode | 0.12 | 0.14 | 0.19 |

| | Extinction coefficient (k) | | |
|---|---|---|---|
| | min | ave | max |
| Resin passivation layer | 0.00 | 0.00 | 0.00 |
| Thin-film passivation layer | 0.00 | 0.011 | 0.08 |
| Transparent cathode | 0.00 | 0.15 | 0.55 |
| Electron transport layer | 0.10 | 0.18 | 0.30 |
| Light-emitting layer (Blue) | 0.00 | 0.15 | 0.62 |
| Hole transport layer | 0.13 | 0.15 | 0.17 |
| Hole injection layer | 0 | 0.17 | 0.91 |
| Transparent conductive layer | 0 | 0.19 | 0.60 |
| Reflective anode | 1.52 | 2.9 | 5.3 |

| | Film thickness in nm | | | | | |
|---|---|---|---|---|---|---|
| | min | | ave | | max | |
| Resin passivation layer | 5400 | | 6000 | | 6600 | |
| Thin-film passivation layer | 558 | | 620 | | 682 | |
| Transparent cathode | 31.5 | | 35 | | 38.5 | |
| Electron transport layer | 31.5 | | 35 | | 38.5 | |
| Light-emitting layer (Blue) | 36 | | 40 | | 44 | |
| Hole transport layer | 18 | | 20 | | 22 | |
| Hole injection layer | 36 | 117 | 40 | 130 | 44 | 143 |
| Transparent conductive layer | 63 | | 70 | | 77 | |
| Reflective anode | 135 | | 150 | | 165 | |

| | Optical film thickness in nm | | | | | |
|---|---|---|---|---|---|---|
| | min | | ave | | max | |
| Resin passivation layer | 7020 | | 9000 | | 11220 | |
| Thin-film passivation layer | 949 | | 1178 | | 1432 | |
| Transparent cathode | 63 | | 77 | | 92.4 | |
| Electron transport layer | 53.6 | | 66.5 | | 80.9 | |
| Light-emitting layer (Blue) | 57.6 | | 72 | | 88 | |
| Hole transport layer | 27 | | 34 | | 41.8 | |
| Hole injection layer | 64.8 | 212 | 80 | 261 | 96.8 | 316 |
| Transparent conductive layer | 119.7 | | 147 | | 177.1 | |
| Reflective anode | — | | — | | — | |

ORGANIC LIGHT-EMITTING ELEMENT, ORGANIC LIGHT-EMITTING DEVICE, ORGANIC DISPLAY PANEL, ORGANIC DISPLAY DEVICE, AND METHOD OF MANUFACTURING AN ORGANIC LIGHT-EMITTING ELEMENT

This is a continuation of International Application PCT/JP2010/005028, with an international filing date of Aug. 10, 2010.

TECHNICAL FIELD

The present invention relates to organic light-emitting elements that rely on the phenomenon of electroluminescence of organic material and in particular to optical design of organic light-emitting elements.

BACKGROUND ART

In recent years, use of organic Electro Luminescence (EL) panels that rely on the phenomenon of electroluminescence of organic material has been proposed for display panels used in display devices such as digital televisions. A matrix of red, green, and blue organic light-emitting elements is arranged in an organic EL panel.

It is important to improve light-extraction efficiency of the light-emitting elements, for example from the standpoint of reducing power consumption or increasing service life of the organic EL panel. To this end, Patent Literature 1 proposes technology for increasing light-extraction efficiency of an organic light-emitting element in which a reflecting anode, a transparent conductive layer, a hole injection layer, a hole transport layer, an organic light-emitting layer, an electron transport layer, an electron injection layer, and a transparent cathode are layered on a substrate. Light-extraction efficiency is increased by using the phenomenon of interference between light that travels directly from the organic light-emitting layer towards the transparent cathode and light that reflects off the reflecting anode after being emitted from the organic light-emitting layer and then travels towards the transparent cathode. Specifically, Patent Literature 1 discloses that by setting the thickness of the transparent conductive layer (refractive index 2.2) to 183 nm, the thickness of the hole injection layer (refractive index 1.85) to 80 nm, and the thickness of the hole transport layer (refractive index 1.85) to 20 nm, the light-extraction efficiency of blue light at a wavelength of 470 nm increased from 2.0% to 3.0% (paragraphs 0043-0045).

PATENT LITERATURE

Patent Literature 1: Japanese Patent Application Publication No. 2003-272855

SUMMARY OF INVENTION

There is still room for improvement of the organic light-emitting element, however, as the light-extraction efficiency of blue light still cannot be considered sufficient as compared to the light-extraction efficiency of green or red light.

It is therefore an object of the present invention to provide an organic light-emitting element, an organic light-emitting device, an organic display panel, an organic display device, and a method of manufacturing organic light-emitting elements that improve the light-extraction efficiency of blue light.

An organic light-emitting element according to an aspect of the present invention comprises a first electrode that reflects incident light; a second electrode, disposed to face the first electrode, that transmits incident light; an organic light-emitting layer, disposed between the first electrode and the second electrode, that emits blue light; a first functional layer disposed between the first electrode and the organic light-emitting layer and composed of one or more layers; and a second functional layer disposed between the organic light-emitting layer and the second electrode and composed of one or more layers; and a coating layer disposed to coat the second electrode and composed of one or more layers, wherein a portion of the blue light emitted from the organic light-emitting layer travels a first optical path by passing through the first functional layer, striking and being reflected by the first electrode, and then being emitted externally after passing through the first functional layer, the organic light-emitting layer, the second functional layer, the second electrode, and the coating layer, a remaining portion of the blue light emitted from the organic light-emitting layer travels a second optical path by travelling through the second functional layer towards the second electrode, instead of towards the first electrode, and being emitted externally after passing through the second electrode and the coating layer, an optical thickness of the first functional layer is greater than 0 nm and not greater than 316 nm, a difference in refractive index between the second electrode and a layer adjacent to the second electrode among the one or more layers composing the second functional layer is from 0.1 to 0.7 inclusive, the second electrode has a physical thickness greater than 0 nm and not greater than 70 nm, a refractive index from 2.0 to 2.4 inclusive, and an optical thickness greater than 0 nm and not greater than 168 nm, and a difference in refractive index between the second electrode and a layer adjacent to the second electrode among the one or more layers composing the coating layer is from 0.1 to 0.7 inclusive.

In an organic light-emitting element according to an aspect of the present invention, the physical thickness of the first functional layer is appropriately adjusted so that an interference effect between light that is emitted from the organic light-emitting layer and travels directly towards the second electrode and light that is emitted from the organic light-emitting layer and is reflected by the first electrode before traveling towards the second electrode strengthens blue light. Furthermore, the physical thickness of the second electrode and the difference in refractive index between the second electrode and the layer adjacent thereto are appropriately adjusted so that multiple reflections within the second electrode further strengthen blue light. These multiplicative effects greatly increase the light-extraction efficiency of blue light.

BRIEF DESCRIPTION OF DRAWINGS

FIG. 6 shows the refractive index, extinction coefficient, physical thickness (nm), and optical thickness (nm) of each layer in the organic light-emitting element.

FIGS. 7A and 7B are mappings of the ratio of luminance to the y value of xy chromaticity.

FIG. 10 compares the light-extraction efficiency and chromaticity of red, green, and blue light when the transparent cathode has a physical thickness of 100 nm and of 35 nm.

FIG. 11 shows the refractive index, extinction coefficient, physical thickness (nm), and optical thickness (nm) of each layer in the organic light-emitting element.

DESCRIPTION OF EMBODIMENTS

[Process by Which an Aspect of the Present Invention was Achieved]

Before concretely describing aspects of the present invention, the following describes the process by which the aspects of the present invention were achieved.

First, in order to increase light-extraction efficiency, the inventors adopted a resonator (cavity) structure for the organic light-emitting element. Specifically, for an organic light-emitting element in which a reflecting anode, a transparent conductive layer, a hole injection layer, a hole transport layer, an organic light-emitting layer, an electron transport layer, an electron injection layer, and a transparent cathode are layered on a substrate, the inventors adjusted the physical thickness of a functional layer (i.e. the transparent conductive layer, the hole injection layer, and the hole transport layer) disposed between the reflective anode and the organic light-emitting layer in order to strengthen light via the phenomenon of interference.

Figure 1:
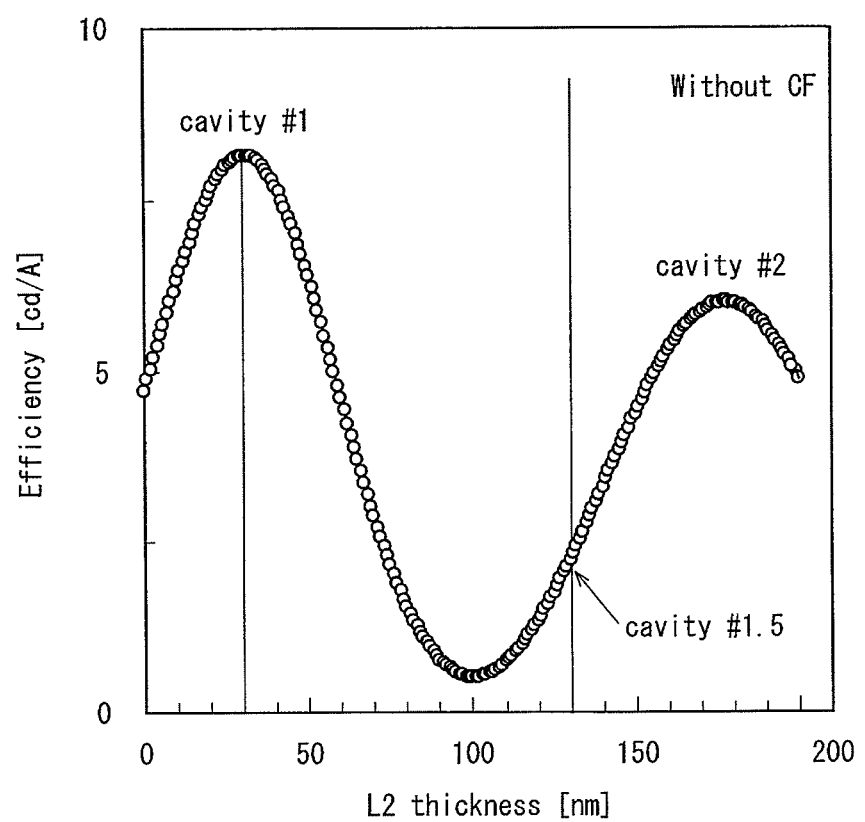
FIG. 1 shows the relationship between (i) a physical thickness L2 of a functional layer provided between the organic light-emitting layer and the reflective anode and (ii) light-extraction efficiency.

FIG. 1 shows the relationship between (i) a physical thickness L2 of the functional layer provided between the organic light-emitting layer and the reflective anode and (ii) light-extraction efficiency. As shown in FIG. 1, by changing the physical thickness L2 of the functional layer, the light-extraction efficiency changes. Normally, in a cavity structure, the physical thickness L2 of the functional layer is adjusted to maximize the light-extraction efficiency. For ease of explanation, cavity structures that are referred to as the first cavity and the second cavity in order of increasing thickness of the functional layer are respectively referred to as cavity #1 and cavity #2 in the present description. Through research, the inventors discovered that, at least for blue light, chromaticity is not necessarily near target chromaticity when light-extraction efficiency is at its maximum value. If chromaticity is far from target chromaticity, a corresponding amount of chromaticity adjustment with a color filter (CF) is necessary. As a result of using the CF, however, the light-extraction efficiency may greatly decrease, thus falling below the original maximum value that was achieved without the CF. This tendency was particularly noticeable for cavity #2. Therefore, instead of adjusting the physical thickness of the functional layer to cavity #2, the inventors purposely shifted the thickness to a location between cavity #1 and cavity #2. For the sake of convenience, this cavity structure is referred to as cavity #1.5. As is clear from the results in FIG. 1, adopting cavity #1 instead of cavity #2 leads to a higher light-extraction efficiency. When a CF is used, adopting cavity #1.5 instead of cavity #2 increases the light-extraction efficiency for the above reasons.

With this sort of cavity structure, although light-extraction efficiency is somewhat increased, the light-extraction efficiency of blue light is still low as compared to green or red light and cannot be considered sufficient for commercialization of an organic display device using organic light-emitting elements. It is thus necessary to further increase the light-extraction efficiency.

Types of cavity structures for organic light-emitting elements include a one-sided reflective type, in which one of the anode and the cathode is reflective and the other is transparent, and a two-sided reflective type, in which one of the anode and the cathode is reflective and the other is semi-reflective (a half mirror). In the one-sided reflective type considered by the inventors, it is known that the physical thickness of the functional layer provided between the reflective anode and the organic light-emitting layer is the principal contributor to light-extraction efficiency. Therefore, while the physical thickness of the functional layer has conventionally been examined not only from an electric perspective, but also from an optical perspective, the physical thickness of layers other than the functional layer is often considered only from the perspective of achieving the intended function of such layers. Specifically, the physical thickness of a passivation layer covering the transparent electrode is set to be several microns from the perspective of guaranteeing passivation, and the physical thickness of the transparent cathode is set to be several hundred nanometers from the perspective of guaranteeing conductivity.

Figure 2:
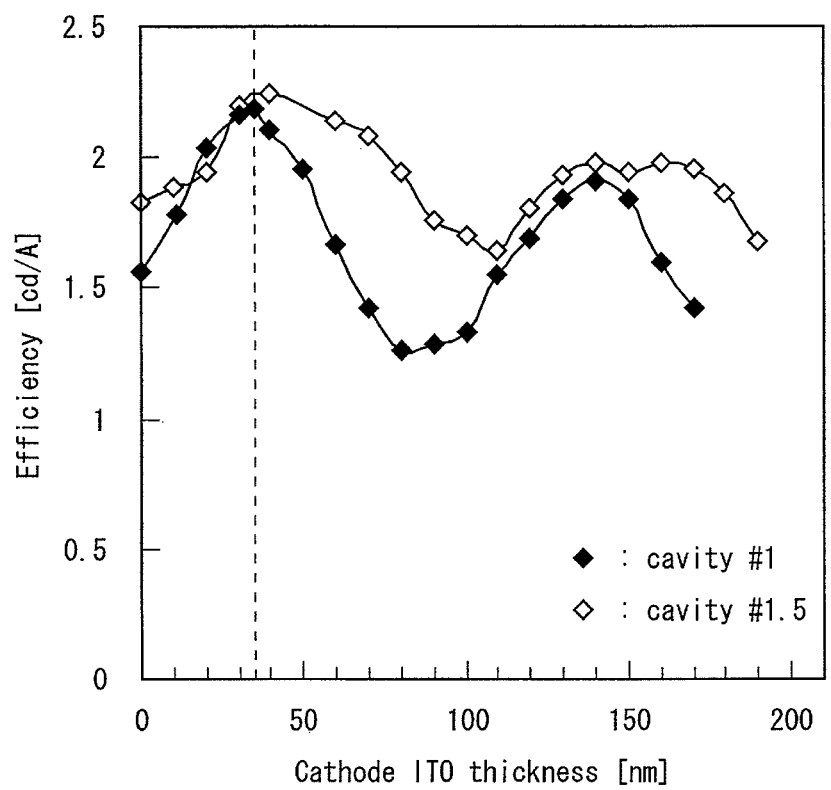
FIG. 2 shows the relationship between the physical thickness of a transparent cathode and light-extraction efficiency.

As indicated above, conventional technological knowledge simply dictates that the physical thickness of the transparent cathode should be relatively thick, i.e. several hundred nanometers, in order to guarantee conductivity. The inventors, however, upon considering the physical thickness of the transparent cathode from an optical perspective without restricting themselves to this conventional technological knowledge, discovered that the physical thickness of the transparent cathode is related to light-extraction efficiency. FIG. 2 shows the relationship between the physical thickness of the transparent cathode and light-extraction efficiency. This figure shows a plot of light-extraction efficiency (cd/A) when adopting Indium Tin Oxide (ITO) for the transparent cathode and when adjusting chromaticity with a color filter so that the y value of the xy chromaticity of emitted light becomes 0.075. As shown in FIG. 2, by changing the physical thickness of the transparent cathode, light-extraction efficiency changes periodically. This suggests the presence of the interference effect of light due to multiple reflections in the transparent cathode. Furthermore, by setting the physical thickness of the transparent cathode to be in a range larger than 0 nm and equal to or less than 70 nm, light-extraction efficiency increases as compared to a conventional physical thickness of approximately 100 nm.

Figure 3:
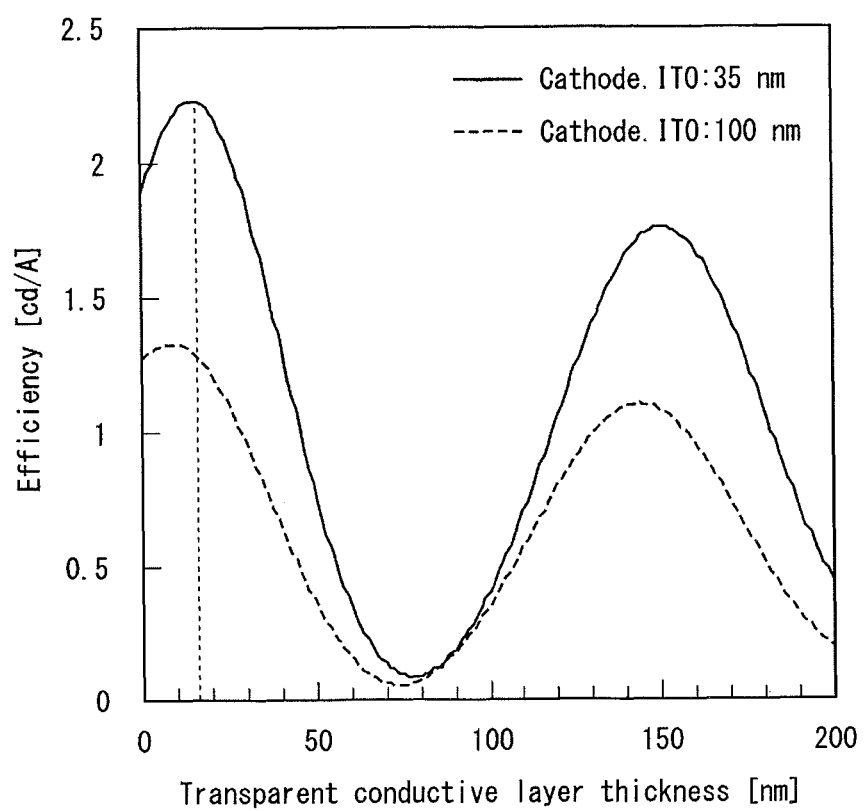
FIG. 3 shows the relationship between (i) the physical thickness of a functional layer provided between the organic light-emitting layer and the reflective anode and (ii) light-extraction efficiency.

In FIG. 2, the physical thickness of the transparent cathode is changed, whereas in FIG. 3, the physical thickness of the transparent conductive layer provided between the organic light-emitting layer and the reflective anode is changed. As shown in FIG. 3, for a physical thickness of the transparent conductive layer of 16 nm (the physical thickness of the hole injection layer being 5 nm, and the physical thickness of the hole transport layer being 10 nm, yielding a physical thickness of 31 nm for the functional layer), when the physical thickness of the transparent cathode is 35 nm, the light-extraction efficiency increases by 1.6 times as compared to a conventional physical thickness of 100 nm. FIG. 3 also shows that the behavior of the change in light-extraction efficiency upon changing the physical thickness of the functional layer remains nearly the same even if the physical thickness of the transparent cathode is changed between 35 nm and 100 nm (for example, the appearance of periodic peaks in the light-extraction efficiency, the location of the peaks, the light-extraction efficiency of cavity #1 being higher than the light-extraction efficiency of cavity #2, and the like). This suggests that further improvement in light-extraction efficiency can be obtained by separately designing the physical thickness of the functional layer and the physical thickness of the transparent cathode and by adjusting each thickness to be optimal.

The inventors arrived at this insight by considering thickness from an optical perspective, including the conventionally overlooked physical thickness of the transparent cathode. The structure of an organic light-emitting element according to an aspect of the present invention is based on this new insight.

An organic light-emitting element according to an aspect of the present invention comprises a first electrode that reflects incident light; a second electrode, disposed to face the first electrode, that transmits incident light; an organic light-emitting layer, disposed between the first electrode and the second electrode, that emits blue light; a first functional layer disposed between the first electrode and the organic light-emitting layer and composed of one or more layers; and a second functional layer disposed between the organic light-emitting layer and the second electrode and composed of one or more layers; and a coating layer disposed to coat the second electrode and composed of one or more layers, wherein a portion of the blue light emitted from the organic light-emitting layer travels a first optical path by passing through the first functional layer, striking and being reflected by the first electrode, and then being emitted externally after passing through the first functional layer, the organic light-emitting layer, the second functional layer, the second electrode, and the coating layer, a remaining portion of the blue light emitted from the organic light-emitting layer travels a second optical path by travelling through the second functional layer towards the second electrode, instead of towards the first electrode, and being emitted externally after passing through the second electrode and the coating layer, an optical thickness of the first functional layer is greater than 0 nm and not greater than 316 nm, a difference in refractive index between the second electrode and a layer adjacent to the second electrode among the one or more layers composing the second functional layer is from 0.1 to 0.7 inclusive, the second electrode has a physical thickness greater than 0 nm and not greater than 70 nm, a refractive index from 2.0 to 2.4 inclusive, and an optical thickness greater than 0 nm and not greater than 168 nm, and a difference in refractive index between the second electrode and a layer adjacent to the second electrode among the one or more layers composing the coating layer is from 0.1 to 0.7 inclusive.

With the above structure, the physical thickness of the first functional layer is appropriately adjusted so that an interference effect between light that is emitted from the organic light-emitting layer and travels directly towards the second electrode and light that is emitted from the organic light-emitting layer and is reflected by the first electrode before traveling towards the second electrode strengthens blue light. Furthermore, the physical thickness of the second electrode and the difference in refractive index between the second electrode and the layer adjacent thereto are appropriately adjusted so that multiple reflections within the second electrode further strengthen blue light. These multiplicative effects greatly increase the light-extraction efficiency of blue light.

Letting the physical thickness of the first functional layer be X3 and the physical thickness of the second electrode be Y3, the values of X3 and Y3 may be in a range defined by the expressions in Math 1.

$X3 = Rx \cos\theta \cos\phi - Ry \sin\theta \sin\phi + X0$ $Y3 = Rx \cos\theta \sin\phi + Ry \sin\theta \cos\phi + Y0$ $-\phi \leq \theta \leq \pi - \phi$ $X0=31, Y0=35, Rx=5.2, Ry=27, \phi=0.15(rad)$ [Math 1]

Letting the physical thickness of the first functional layer be X3 and the physical thickness of the second electrode be Y3, the values of X3 and Y3 may be in a range defined by the expressions in Math 2.

$X3 = Rx \cos\theta \cos\phi - Ry \sin\theta \sin\phi + X0$ $Y3 = Rx \cos\theta \sin\phi + Ry \sin\theta \cos\phi + Y0$ $-\phi \leq \theta \leq \pi - \phi$ $X0=130, Y0=35, Rx=8, Ry=15, \phi=0.20(rad)$ [Math 2]

A refractive index of the layer adjacent to the second electrode among the one or more layers composing the second functional layer may be from 1.7 to 2.1 inclusive, and a refractive index of the layer adjacent to the second electrode among the one or more layers composing the coating layer may be from 1.7 to 2.1 inclusive.

The physical thickness of the second electrode may be from 30 nm to 60 nm inclusive, and the optical thickness of the second electrode may be from 60 nm to 144 nm inclusive.

The physical thickness of the second electrode may be from 30 nm to 70 nm inclusive, and the optical thickness of the second electrode may be from 60 nm to 168 nm inclusive.

The second functional layer may include an electron transport layer that transports electrons to the organic light-emitting layer, the second electrode may be a cathode, and the coating layer may include a first passivation layer formed on the cathode and a second passivation layer formed on the first passivation layer.

The electron transport layer may have a physical thickness from 31.5 nm to 38.5 nm inclusive and a refractive index from 1.7 to 2.1 inclusive, the cathode may have a physical thickness from 31.5 nm to 38.5 nm inclusive, a refractive index from 2.0 to 2.4 inclusive, and an optical thickness from 63 nm to 92.4 nm inclusive, the first passivation layer may have a physical thickness from 558 nm to 682 nm inclusive and a refractive index from 1.7 to 2.1 inclusive, and the second passivation layer may have a physical thickness from 5400 nm to 6600 nm inclusive and a refractive index from 1.3 to 1.7 inclusive.

The first electrode may be an anode, and the first functional layer may include a transparent conductive layer formed on the anode, a hole injection layer formed on the transparent conductive layer, and a hole transport layer formed on the hole injection layer.

The transparent conductive layer may have a physical thickness from 14.4 nm to 17.6 nm inclusive and a refractive index from 1.9 to 2.3 inclusive, the hole injection layer may have a physical thickness from 4.5 nm to 5.5 nm inclusive and a refractive index from 1.8 to 2.2 inclusive, and the hole transport layer may have a physical thickness from 9 nm to 11 nm inclusive and a refractive index from 1.5 to 1.9 inclusive.

The transparent conductive layer may have a physical thickness from 63 nm to 77 nm inclusive and a refractive index from 1.9 to 2.3 inclusive, the hole injection layer may have a physical thickness from 36 nm to 44 nm inclusive and a refractive index from 1.8 to 2.2 inclusive, and the hole transport layer may have a physical thickness from 18 nm to 22 nm inclusive and a refractive index from 1.5 to 1.9 inclusive.

The optical thickness of the first functional layer may be from 49.0 nm to 73.5 nm inclusive, and the optical thickness of the second electrode may be from 63 nm to 92.4 nm inclusive.

The optical thickness of the first functional layer may be from 212 nm to 316 nm inclusive, and the optical thickness of the second electrode may be from 63 nm to 92.4 nm inclusive.

An organic light-emitting device according to an aspect of the present invention comprises the above organic light-emitting element.

An organic display panel according to an aspect of the present invention comprises the above organic light-emitting element.

An organic display device according to an aspect of the present invention comprises the above organic light-emitting element.

A method of manufacturing an organic light-emitting element according to an aspect of the present invention comprises: preparing a first electrode that reflects incident light; forming, on the first electrode, a first functional layer composed of one or more layers; forming, on the first functional layer, an organic light-emitting layer that emits blue light; forming, on the organic light-emitting layer, a second functional layer composed of one or more layers that differ from the first functional layer; forming, on the second functional layer, a second electrode that transmits incident light; and coating the second electrode with a coating layer composed of one or more layers, wherein the first functional layer is formed to have an optical thickness greater than 0 nm and not greater than 316 nm, material used to form the second functional layer is such that a difference in refractive index between the second electrode and a layer adjacent to the second electrode among the one or more layers composing the second functional layer is from 0.1 to 0.7 inclusive, the second electrode is formed to have a physical thickness greater than 0 nm and not greater than 70 nm, a refractive index from 2.0 to 2.4 inclusive, and an optical thickness greater than 0 nm and not greater than 168 nm, and material used to form the coating layer is such that a difference in refractive index between the second electrode and a layer adjacent to the second electrode among the one or more layers composing the coating layer is from 0.1 to 0.7 inclusive.

Letting the physical thickness of the first functional layer be X3 and the physical thickness of the second electrode be Y3, the first functional layer and the second electrode may be formed so that the values of X3 and Y3 are in a range defined by the expressions in Math 1.

$X3 = Rx \cos\theta \cos\phi - Ry \sin\theta \sin\phi + X0$ $Y3 = Rx \cos\theta \sin\phi + Ry \sin\theta \cos\phi + Y0$ $-\phi \leq \theta \leq \pi - \phi$ $X0=31, Y0=35, Rx=5.2, Ry=27, \phi=0.15(rad)$ [Math 1]

Letting the physical thickness of the first functional layer be X3 and the physical thickness of the second electrode be Y3, the first functional layer and the second electrode may be formed so that the values of X3 and Y3 are in a range defined by the expressions in Math 2.

$X3 = Rx \cos\theta \cos\phi - Ry \sin\theta \sin\phi + X0$ $Y3 = Rx \cos\theta \sin\phi + Ry \sin\theta \cos\phi + Y0$ $-\phi \leq \theta \leq \pi - \phi$ $X0=130, Y0=35, Rx=8, Ry=15, \phi=0.20(rad)$ [Math 2]

Material having a refractive index from 1.7 to 2.1 inclusive may be used to form the layer adjacent to the second electrode among the one or more layers composing the second functional layer, and material used to form the coating layer may be such that a refractive index of the layer adjacent to the second electrode among the one or more layers composing the coating layer is from 1.7 to 2.1 inclusive.

An anode may be formed as the first electrode. As the first functional layer, a transparent conductive layer may be formed on the anode, a hole injection layer may be formed on the transparent conductive layer, and a hole transport layer may be formed on the hole injection layer. The transparent conductive layer may be formed from material having a refractive index from 1.9 to 2.3 inclusive and is formed to have a physical thickness from 14.4 nm to 17.6 nm inclusive. The hole injection layer may be formed from material having a refractive index from 1.8 to 2.2 inclusive and is formed to have a physical thickness from 4.5 nm to 5.5 nm inclusive. The hole transport layer may be formed from material having a refractive index from 1.5 to 1.9 inclusive and is formed to have a physical thickness from 9 nm to 11 nm inclusive. The organic light-emitting layer may be formed from material having a refractive index from 1.6 to 2.0 inclusive and is formed to have a physical thickness from 36 nm to 44 nm inclusive. As the second functional layer, an electron transport layer that transports electrons to the organic light-emitting layer may be formed from material having a refractive index from 1.7 to 2.1 inclusive and may be formed to have a physical thickness from 31.5 nm to 38.5 nm inclusive. As the second electrode, a cathode may be formed on the electron transport layer from material having a refractive index from 2.0 to 2.4 inclusive, may be formed to have a physical thickness from 31.5 nm to 38.5 nm inclusive, and may be formed to have an optical thickness from 63 nm to 92.4 nm inclusive. As the coating layer, a first passivation layer may be formed on the cathode and a second passivation layer may be formed on the first passivation layer. The first passivation layer may be formed from material having a refractive index from 1.7 to 2.1 inclusive and may be formed to have a physical thickness from 558 nm to 682 nm inclusive. The second passivation layer may be formed from material having a refractive index from 1.3 to 1.7 inclusive and may be formed to have a physical thickness from 5400 nm to 6600 nm inclusive.

An anode may be formed as the first electrode. As the first functional layer, a transparent conductive layer may be formed on the anode, a hole injection layer may be formed on the transparent conductive layer, and a hole transport layer may be formed on the hole injection layer. The transparent conductive layer may be formed from material having a refractive index from 1.9 to 2.3 inclusive and may be formed to have a physical thickness from 63 nm to 77 nm inclusive. The hole injection layer may be formed from material having a refractive index from 1.8 to 2.2 inclusive and may be formed to have a physical thickness from 36 nm to 44 nm inclusive. The hole transport layer may be formed from material having a refractive index from 1.5 to 1.9 inclusive and may be formed to have a physical thickness from 18 nm to 22 nm inclusive. The organic light-emitting layer may be formed from material having a refractive index from 1.6 to 2.0 inclusive and may be formed to have a physical thickness from 36 nm to 44 nm inclusive. As the second functional layer, an electron transport layer that transports electrons to the organic light-emitting layer may be formed from material having a refractive index from 1.7 to 2.1 inclusive and may be formed to have a physical thickness from 31.5 nm to 38.5 nm inclusive. As the second electrode, a cathode may be formed on the electron transport layer from material having a refractive index from 2.0 to 2.4 inclusive, may be formed to have a physical thickness from 31.5 nm to 38.5 nm inclusive, and may be formed to have an optical thickness from 63 nm to 92.4 nm inclusive. As the coating layer, a first passivation layer may be formed on the cathode and a second passivation layer may be formed on the first passivation layer. The first passivation layer may be formed from material having a refractive index from 1.7 to 2.1 inclusive and may be formed to have a physical thickness from 558 nm to 682 nm inclusive. The second passivation layer may be formed from material having a refractive index from 1.3 to 1.7 inclusive and may be formed to have a physical thickness from 5400 nm to 6600 nm inclusive.

[Structure of Organic Light-Emitting Element]

Figure 4:
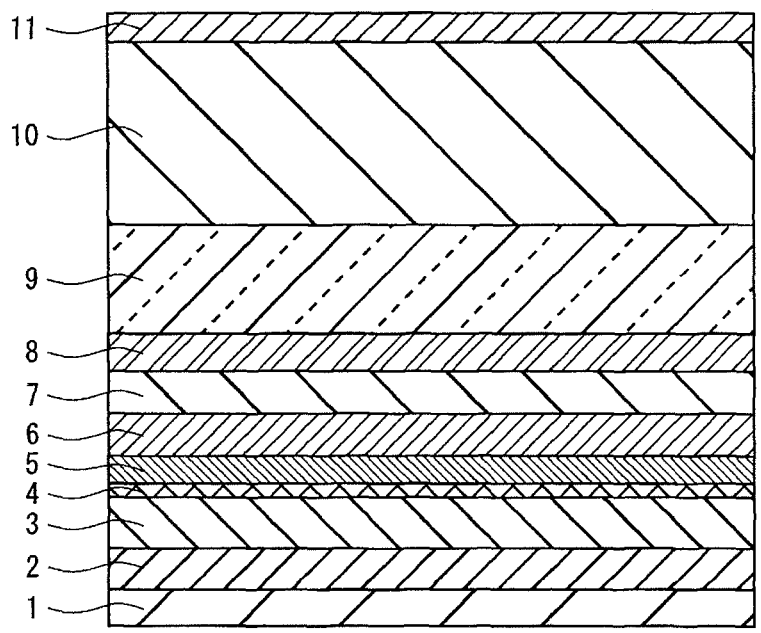
FIG. 4 schematically shows the structure of an organic light-emitting element according to an embodiment of the present invention.

FIG. 4 schematically shows the structure of an organic light-emitting element according to an embodiment of the present invention.

The organic light-emitting element is provided with a substrate 1, a reflective anode 2, a transparent conductive layer 3, a hole injection layer 4, a hole transport layer 5, an organic light-emitting layer 6, an electron transport layer 7, a transparent cathode 8, a thin-film passivation layer 9, a resin passivation layer 10, and a substrate 11. Hereinafter, the transparent conductive layer 3, the hole injection layer 4, and the hole transport layer 5 are referred to as a "first functional layer", the electron transport layer 7 is referred to as a "second functional layer", and the thin-film passivation layer 9 and a resin passivation layer 10 are referred to as a "coating layer".

Figure 5:
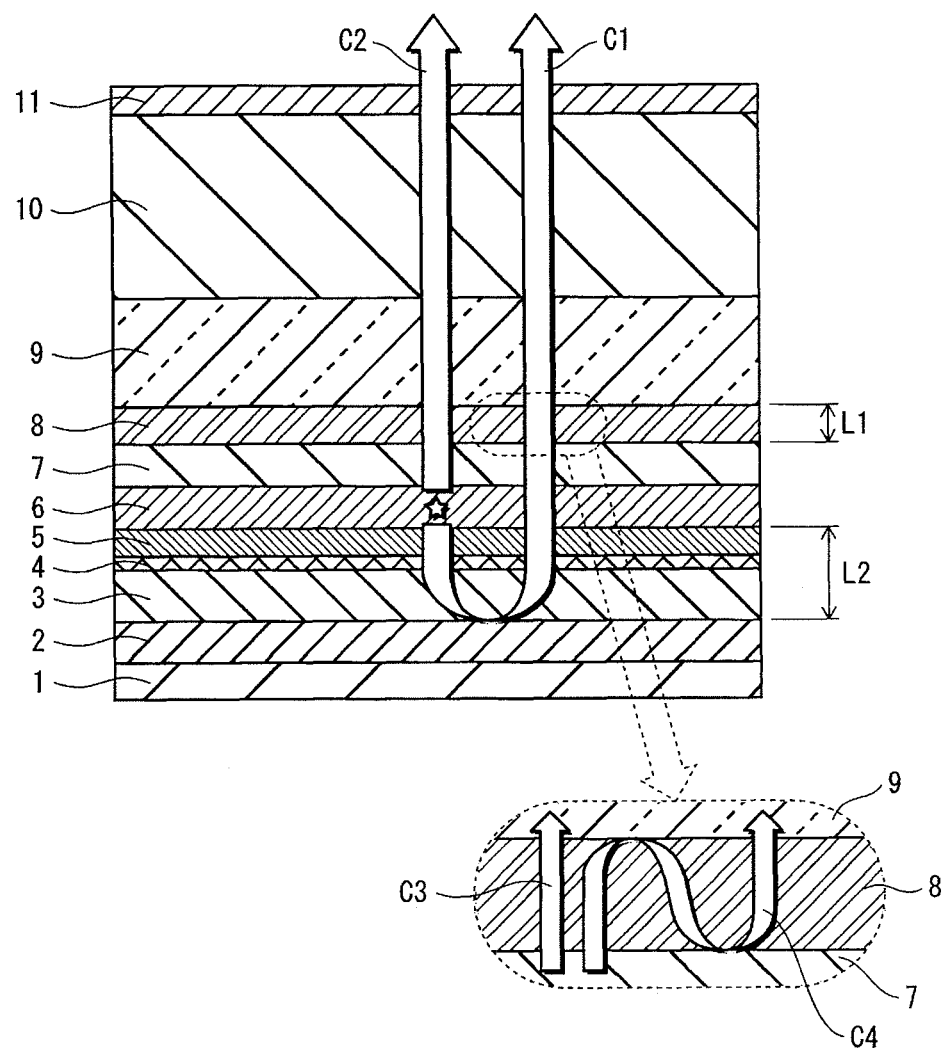
FIG. 5 shows optical paths in an organic light-emitting element according to an embodiment of the present invention.

In the organic light-emitting element, the reflective anode 2 constitutes a cavity structure. As shown in FIG. 5, two optical paths are formed in the organic light-emitting element: a first optical path C1, in which a portion of blue light emitted from the organic light-emitting layer 6 passes through the first functional layer, strikes and is reflected by the reflective anode, and then is emitted externally after passing through the first functional layer, the organic light-emitting layer 6, the second functional layer, the transparent cathode 8, and the coating layer, and a second optical path C2, in which a remaining portion of the blue light emitted from the organic light-emitting layer 6 travels through the second functional layer towards the transparent cathode 8, instead of towards the reflective anode 2, and is emitted externally after passing through the transparent cathode 8 and the coating layer. Light-extraction efficiency of the organic light-emitting element is increased by adjusting the physical thickness L2 of the first functional layer so that light traveling the first optical path and light traveling the second optical path strengthen each other through the interference effect.

Furthermore, in addition to a third optical path C3 by which light is emitted externally after passing directly through the transparent cathode 8, a fourth optical path C4 is formed in the organic light-emitting element, by which light is emitted externally after multiple reflections in the transparent cathode 8 at the boundary surfaces with the electron transport layer 7 and the thin-film passivation layer 9. Light-extraction efficiency of the organic light-emitting element is increased by adjusting the physical thickness L1 of the transparent cathode 8 so that light traveling the fourth optical path and light traveling other paths strengthen each other through the interference effect.

The following describes preferable ranges for optical constants and thickness of the layers with reference to simulation results.

[Simulation (Cavity #1)]

<Conditions>

FIG. 6 shows the refractive index, extinction coefficient, physical thickness (nm), and optical thickness (nm) of each layer in the organic light-emitting element. The simulation was performed using an average (ave). In an actual organic light-emitting element, however, product tolerance exists with respect to optical characteristics. Therefore, a minimum (min) and a maximum (max) are prescribed assuming tolerance of approximately ±10%. The material for the transparent conductive layer is Indium Zinc Oxide (IZO), the material for the transparent cathode is Indium Tin Oxide (ITO), the material for the reflective anode is aluminum, and the material for the organic light-emitting layer is BP105 by SUMATION Co.

<Consideration 1>

The results in FIG. 2 were obtained when changing the physical thickness of the transparent cathode among the parameters in FIG. 6. From FIG. 2, it is clear that if the physical thickness of the transparent cathode is greater than 0 nm but not greater than 70 nm, light-extraction efficiency is increased as compared to when the physical thickness is 100 nm. Furthermore, as described above, a change in the light-extraction efficiency in response to the physical thickness of the transparent cathode is considered to indicate an interference effect of light within the transparent cathode. Therefore, it is considered that the difference in refractive index between the transparent cathode and the layer adjacent thereto also contributes to the increase in light-extraction efficiency observed in the results in FIG. 2. It can thus be asserted that light-extraction efficiency increases if the following conditions for the transparent cathode are satisfied.

(1) Physical thickness L1 of the transparent cathode: $0\ nm < L1 \leq 70\ nm$ (2) Refractive index n of the transparent cathode: $2.0 \leq n \leq 2.4$ (3) Optical thickness Lc1 of the transparent cathode: $0\ nm < Lc1 \leq 168\ nm$ (4) Difference in refractive index ndif between the transparent anode and the electron transport layer: $0.1 \leq ndif \leq 0.7$ (5) Difference in refractive index ndif between the transparent anode and the thin-film passivation layer: $0.1 \leq ndif \leq 0.7$ Note that for a single layer structure, the optical thickness is the product of physical thickness and refractive index, and for a multilayer structure with two or more layers, the optical thickness is the sum of the product of the physical thickness and refractive index for each layer.

The results in FIG. 3 were obtained when changing the physical thickness of the transparent conductive layer among the parameters in FIG. 6. From FIG. 3, it is clear that the light-extraction efficiency is at a maximum when the physical thickness of the transparent conductive layer is 16 nm. The change in light-extraction efficiency when the physical thickness of the transparent conductive layer is changed is considered to indicate an interference effect between light that is emitted from the organic light-emitting layer and travels the first optical path C1 and light that is emitted from the organic light-emitting layer and travels the second optical path C2. Accordingly, the physical thickness of the first functional layer in fact contributes to increasing light-extraction efficiency. To increase light-extraction efficiency as much as possible, the physical thickness of the first functional layer should be set to 31 nm. Note that out of consideration for product tolerance, it can be asserted that light-extraction efficiency increases if the following conditions for the first functional layer are satisfied.

(6) Physical thickness L2 of the first functional layer: 27.9 nm≤L2≤34.1 nm (7) Optical thickness Lc2 of the first functional layer: 49.0 nm≤Lc2≤73.5 nm Light-extraction efficiency is increased by satisfying the above conditions (1)-(7).

<Consideration 2>

FIGS. 7A and 7B are mappings of the ratio of luminance to the y value of xy chromaticity, with the physical thickness of the first functional layer on the horizontal axis and the physical thickness of the transparent cathode on the vertical axis. If the luminance of emitted blue light is increased by adopting a cavity structure, chromaticity (in particular, the y value) may shift from the target chromaticity. It is thus necessary to increase luminance while reducing the shift in chromaticity of emitted light. The ratio of luminance to the y value is a useful measure for assessing the balance between the effect of reducing the shift in chromaticity and the effect of increasing luminance. A larger value of this ratio is preferable. FIG. 7A shows contours over the range of 290-350, each contour having a width of 20. FIG. 7B shows contours, each having a width of five, over an extracted range of 335-350 that is assessed as being good in FIG. 7A. Fitting an ellipse to the good range shown in FIG. 7B yields the expressions in Math 1 below.

$$X3 = Rx \cos\theta \cos\phi - Ry \sin\theta \sin\phi + X0$$

$$Y3 = Rx \cos\theta \sin\phi + Ry \sin\theta \cos\phi + Y0$$

$$-\phi \leq \theta \leq \pi - \phi$$

$$X0=31, Y0=35, Rx=5.2, Ry=27, \phi=0.15(rad) \quad \text{[Math 1]}$$

In these expressions, X3 is the physical thickness L2 of the first functional layer, and Y3 is the physical thickness L1 of the transparent cathode.

Figure 8:
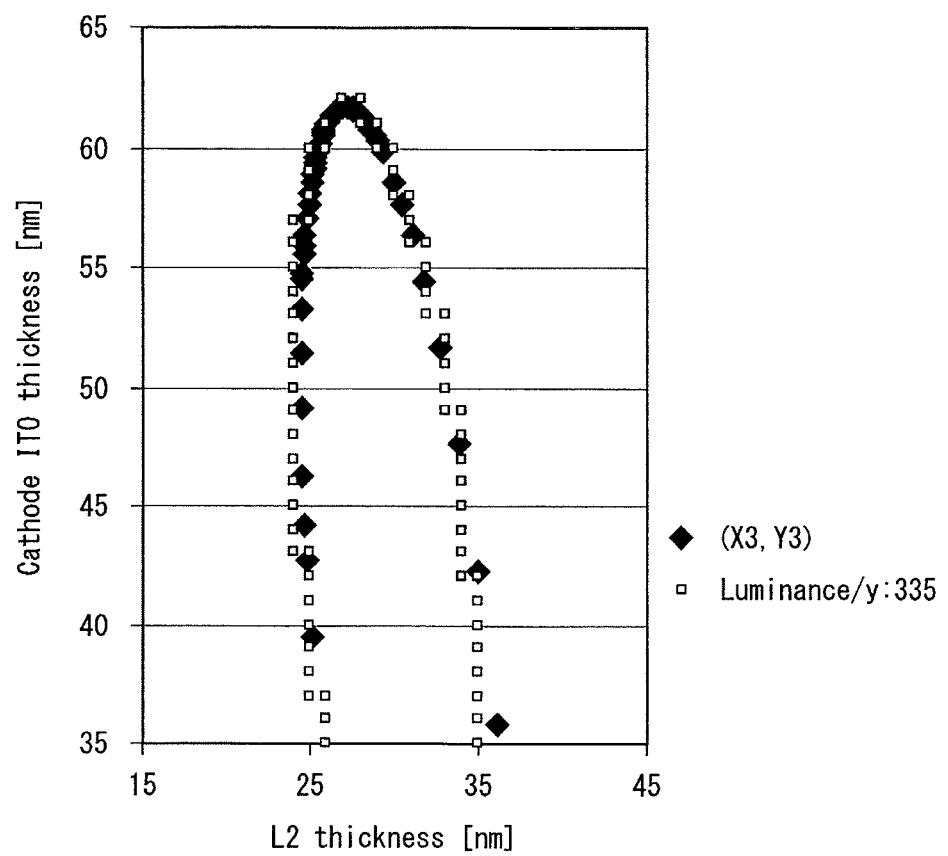
FIG. 8 is a plot of data for which the ratio of luminance to the y value is the smallest value that is at least 335, and of data obtained from Math 1.

FIG. 8 is a plot of data for which the ratio of luminance to the y value is the smallest value that is at least 335, and of data obtained from Math 1. FIG. 8 shows that Math 1 is an accurate fit.

Based on the above, if the physical thickness X3 of the first functional layer and the physical thickness Y3 of the transparent cathode are within the ranges indicated by the expressions in Math 1, luminance is increased while reducing the shift in chromaticity of emitted blue light.

<Consideration 3>

Figure 9:
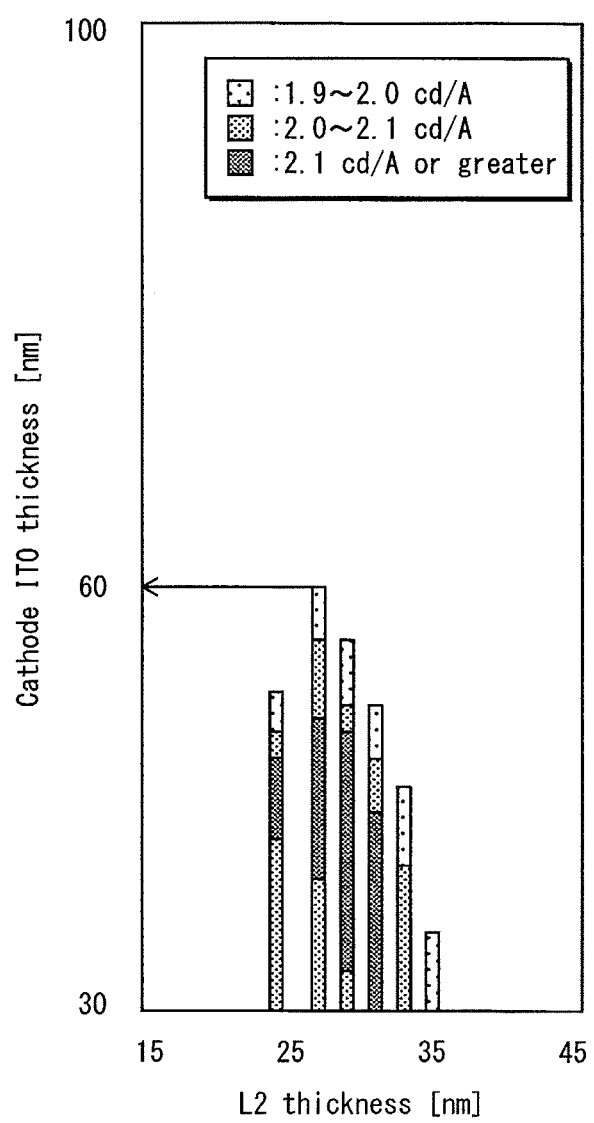
FIG. 9 is a mapping of the ratio of light-extraction efficiency to the y value of xy chromaticity when correcting chromaticity with a color filter.

FIG. 9 shows the results of mapping the light-extraction efficiency as in FIG. 8 for the case of adjusting chromaticity with a color filter. It is clear from FIG. 9 that it is more preferable for the physical thickness L1 of the transparent cathode to be equal to or less than 60 nm. Furthermore, while it suffices for the physical thickness L1 of the transparent cathode to be greater than 0 nm, it is preferable for the physical thickness L1 to be equal to or greater than 30 nm in order to guarantee conductivity, the original purpose of the transparent cathode.

Based on the above, the preferred range for the physical thickness L1 of the transparent cathode can be said to be from 30 nm to 60 nm inclusive. The optical thickness in this case is from 60 nm (=30×2.0) to 144 nm (=60×2.4) inclusive.

<Consideration 4>

As shown in FIGS. 2 and 3, when the physical thickness of the transparent cathode is 35 nm and the physical thickness of the first functional layer is 31 nm, the light-extraction efficiency is greatly improved. FIGS. 7A and 7B indicate that when the physical thickness of the transparent cathode is 35 nm and the physical thickness of the first functional layer is 31 nm, the ratio of luminance to the y value is in a range from 345 to 350. Conversely, it can thus be said that if ratio of luminance to the y value is in a range from 345 to 350, the same effects are achieved as when the physical thickness of the transparent cathode is 35 and the physical thickness of the first functional layer is 31 nm.

In FIGS. 7A and 7B, the ratio of luminance to the y value is in a range from 345 to 350 when the physical thickness of the first functional layer is from 27 nm to 32 nm inclusive and the physical thickness of the transparent cathode is from 35 nm to 53 nm inclusive. Accordingly, satisfying these conditions is even more preferable, as the light-extraction efficiency is greatly improved.

<Consideration 5>

FIG. 10 compares the light-extraction efficiency and chromaticity of red, green, and blue light when the transparent cathode has a physical thickness of 100 nm and of 35 nm.

Setting the physical thickness of the transparent cathode to 35 nm leads to an improvement in the light-extraction efficiency of 165% for blue light and 112% for green light as compared to a physical thickness of 100 nm. On the other hand, the light-extraction efficiency of red light decreases, but not to the point of being particularly problematic. [Simulation (Cavity #1.5)]

The following describes a simulation in which cavity #1.5 was adopted as the cavity structure.

<Consideration 6>

FIG. 11 shows the refractive index, extinction coefficient, physical thickness (nm), and optical thickness (nm) of each layer in the organic light-emitting element. The only differences between cavity #1 and cavity #1.5 are the physical thickness L2 and the optical thickness Lc2 of the first functional layer. Specifically, in cavity #1, the physical thickness of the first functional layer is from 27.9 nm to 34.1 nm inclusive, and the optical thickness is from 49.0 nm to 73.5 nm inclusive, whereas in cavity #1.5, the physical thickness of the first functional layer is from 117 nm to 143 nm inclusive, and the optical thickness is from 212 nm to 316 nm inclusive. Other parameters are the same for cavity #1 and cavity #1.5.

The results in FIG. 2 were obtained when changing the physical thickness of the transparent cathode among the parameters in FIG. 11. As is clear from FIG. 2, the increase in light-extraction efficiency based on multiple reflections in the transparent cathode is the same for cavity #1 and cavity #1.5.

Accordingly, as with cavity #1, light-extraction efficiency is increased for cavity #1.5 if the following conditions are satisfied.

(1) Physical thickness L1 of the transparent cathode: 0 nm<L1≤70 nm (2) Refractive index n of the transparent cathode: 2.0≤n≤2.4

(3) Optical thickness Lc1 of the transparent cathode: 0 nm<Lc1≤168 nm (4) Difference in refractive index ndif between the transparent anode and the electron transport layer: 0.1≤ndif≤0.7

(5) Difference in refractive index ndif between the transparent anode and the thin-film passivation layer: 0.1≤ndif≤0.7

<Consideration 7>

Figure 12A:
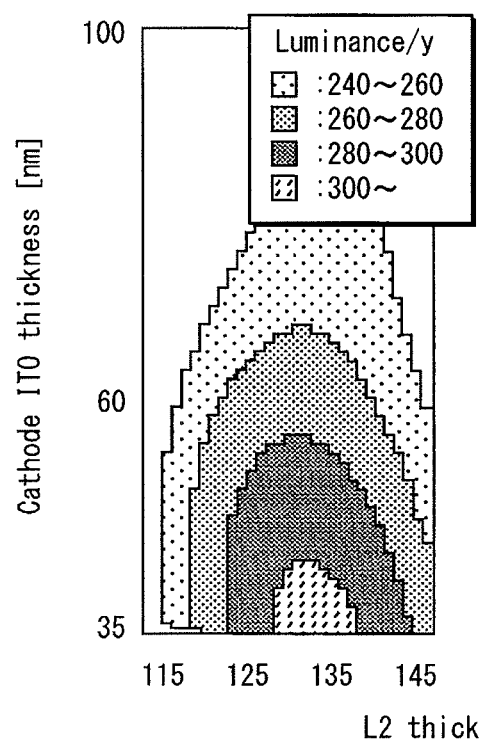
FIGS. 12A and 12B are mappings of the ratio of luminance to the y value of xy chromaticity.
Figure 12B:
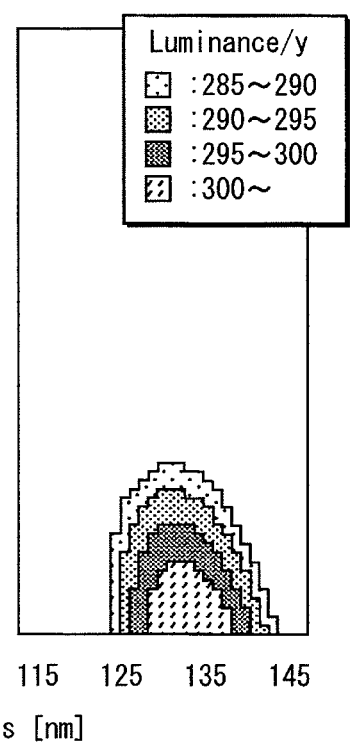

For cavity #1.5 as well, a mapping of the ratio of luminance to the y value of xy chromaticity is as in FIGS. 12A and 12B. The light-extraction efficiency is greatly improved in cavity #1.5 when the physical thickness of the transparent cathode is 35 nm and the physical thickness of the first functional layer is 130 nm. Fitting an ellipse to the good range shown in FIG. 12B yields the expressions in Math 2 below.

$$X3 = Rx \cos\theta \cos\phi - Ry \sin\theta \sin\phi + X0$$

$$Y3 = Rx \cos\theta \sin\phi + Ry \sin\theta \cos\phi + Y0$$

$$-\phi \leq \theta \leq \pi - \phi$$

$$X0=130, Y0=35, Rx=8, Ry=15, \phi=0.20(rad) \quad \text{[Math 2]}$$

In these expressions, X3 is the physical thickness L2 of the first functional layer, and Y3 is the physical thickness L1 of the transparent cathode.

Figure 13:
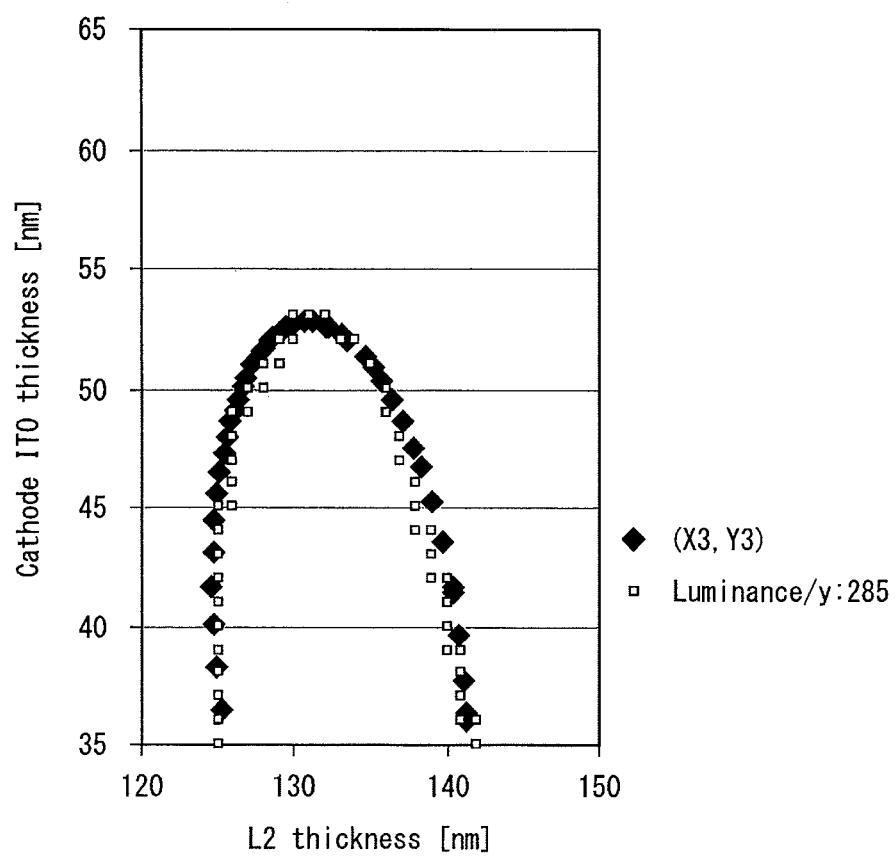
FIG. 13 is a plot of data for which the ratio of luminance to the y value is the smallest value that is at least 285, and of data obtained from Math 2.

FIG. 13 is a plot of data for which the ratio of luminance to the y value is the smallest value that is at least 285, and of data obtained from Math 2. FIG. 13 shows that Math 2 is an accurate fit.

Based on the above, if the physical thickness X3 of the first functional layer and the physical thickness Y3 of the transparent cathode are within the ranges indicated by the expressions in Math 2, luminance is increased while reducing the shift in chromaticity of emitted blue light.

<Consideration 8>

Figure 14:
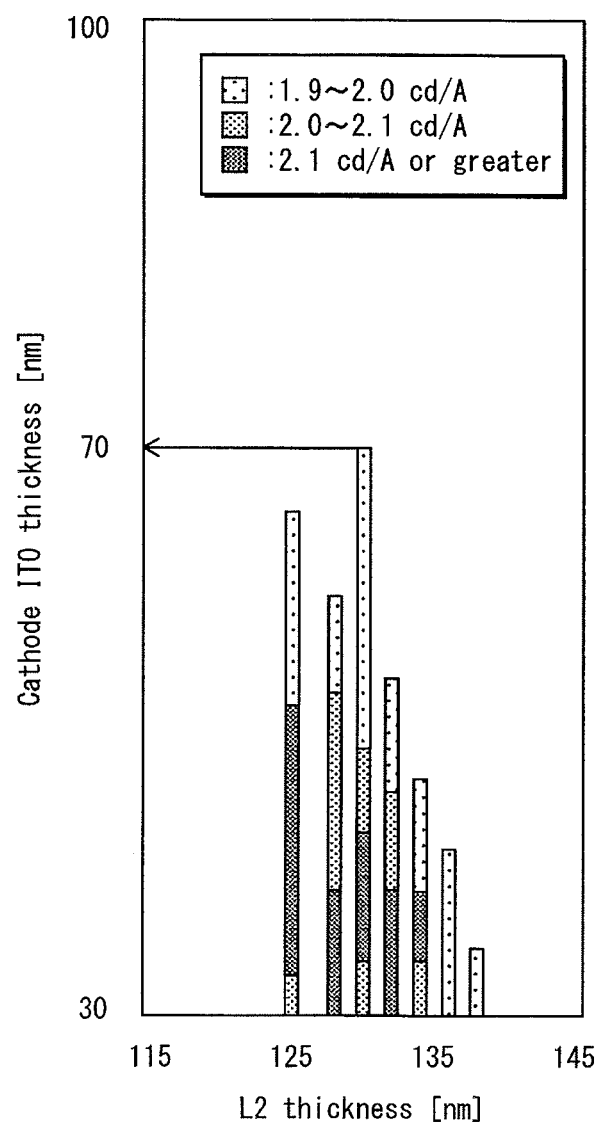
FIG. 14 is a mapping of the ratio of light-extraction efficiency to the y value of xy chromaticity when adjusting chromaticity with a color filter.

FIG. 14 is a mapping of light-extraction efficiency when adjusting chromaticity with a color filter for cavity #1.5. It is clear from FIG. 14 that it is more preferable for the physical thickness L1 of the transparent cathode to be equal to or less than 70 nm. Furthermore, it is preferable for the physical thickness L1 to be equal to or greater than 30 nm in order to guarantee conductivity, the original purpose of the transparent cathode.

Based on the above, the preferred range for the physical thickness L1 of the transparent cathode can be said to be from 30 nm to 70 nm inclusive for cavity #1.5. The optical thickness in this case is from 60 nm (=30×2.0) to 168 nm (=70×2.4) inclusive.

<Consideration 9>

According to the same arguments as in Consideration 4, in cavity #1.5 it is even more preferable for the physical thickness of the first functional layer to be from 129 nm to 137 nm, inclusive, and for the physical thickness of the transparent cathode to be from 35 nm to 42 nm, inclusive, as the light-extraction efficiency is greatly improved.

[Organic Display Panel]

Figure 15:
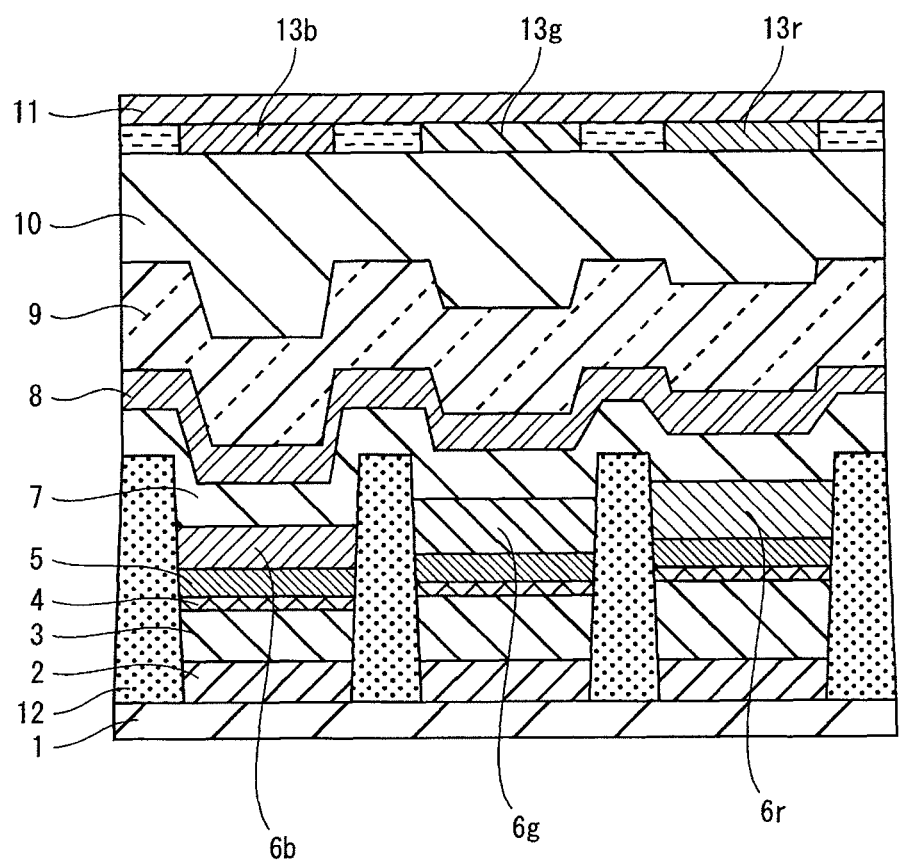
FIG. 15 schematically shows the pixel structure of an organic display panel according to an embodiment of the present invention.

FIG. 15 is a cross-section diagram schematically showing the pixel structure of an organic display panel according to an embodiment of the present invention. The organic display panel has red, green, and blue pixels arranged regularly in a matrix of rows and columns. Each pixel is formed by an organic light-emitting element that uses an organic material.

The blue organic light-emitting element includes a substrate 1, a reflective anode 2, a transparent conductive layer 3, a hole injection layer 4, a hole transport layer 5, an organic light-emitting layer 6b, an electron transport layer 7, a transparent cathode 8, a thin-film passivation layer 9, a resin passivation layer 10, and a substrate 11. The green organic light-emitting element has the same structure as the blue organic light-emitting element, except for an organic light-emitting layer 6g. The red organic light-emitting element also has the same structure as the blue organic light-emitting element, except for an organic light-emitting layer 6r. In this example, the substrate 1, electron transport layer 7, transparent cathode 8, thin-film passivation layer 9, and resin passivation layer 10 are shared by the organic light-emitting elements of each color, whereas other layers are partitioned by banks 12. Furthermore, color filters 13b, 13g, and 13r are provided as necessary.

[Specific Examples of Each Layer]

<Substrate>

The substrate 1 is a Thin Film Transistor (TFT) substrate, for example. The substrate 1 is a glass plate or quartz plate of soda glass, nonfluorescent glass, phosphate glass, borate glass, or the like; a plastic plate or plastic film of acrylic resin, styrenic resin, polycarbonate resin, epoxy resin, polyethylene, polyester, silicone resin, or the like; or a metal plate or metal foil of alumina or the like.

<Banks>

The banks 12 should be formed from an insulating material, and it is preferable that the banks 2 have organic solvent resistance. Furthermore, since the banks 12 undergo etching, baking, and the like, it is preferable that the banks 12 be formed from a material that is highly resistant to such processes. The material for the banks 12 may be an organic material such as resin, or an inorganic material such as glass. As an organic material, acrylic resin, polyimide resin, novolac-type phenolic resin, and the like can be used, and as an inorganic material, silicon dioxide ($SiO_2$), silicon nitride ($Si_3N_4$), and the like can be used.

<Reflective Anode>

The reflective anode 2 is electrically connected to the TFT provided on the substrate 1. In addition to functioning as a positive terminal of the organic light-emitting element, the reflective anode 2 has the function of reflecting light emitted from the organic light-emitting layers 6b, 6g, and 6r towards the reflective anode 2. The reflecting function may be achieved by the structural material of the reflective anode 2 or by applying a reflective coating to the surface portion of the reflective anode 2. For example, the reflective anode 2 is formed from Ag (silver), APC (alloy of silver, palladium, and copper), ARA (alloy of silver, rubidium, and gold), MoCr (alloy of molybdenum and chromium), NiCr (alloy of nickel and chromium), or the like.

<Transparent Conductive Layer>

The transparent conductive layer 3 functions as a protective layer to prevent the reflective anode 2 from naturally oxidizing during the manufacturing process. The material for the transparent conductive layer 3 should be formed from a conductive material sufficiently translucent with respect to light emitted by the organic light-emitting layers 6b, 6g, and 6r. For example, the transparent conductive layer 3 is preferably formed from ITO or IZO, which achieve good conductivity even when a film thereof is formed at room temperature.

<Hole Injection Layer>

The hole injection layer 4 has the function of injecting holes into the organic light-emitting layers 6b, 6g, and 6r. The hole injection layer 4 is formed from an oxide of a transition metal, such as tungsten oxide (WOx), molybdenum oxide (MoOx), molybdenum tungsten oxide (MoxWyOz), or the like. Forming the hole injection layer 4 from an oxide of a transition metal allows for improvement of voltage-current density characteristics, and for an increase in emission intensity by increasing current density. Note that other metal compounds, such as a transition metal nitride, may also be used.

<Hole Transport Layer>

Examples of the material for the hole transport layer 5 include a triazole derivative, an oxadiazole derivative, an imidazole derivative, a polyarylalkane derivative, a pyrazoline derivative and pyrazolone derivative, a phenylenediamine derivative, an arylamine derivative, an amino-substituted chalcone derivative, an oxazole derivative, a styrylanthracene derivative, a fluorenone derivative, a hydrazone derivative, a stilbene derivative, a porphyrin compound, an aromatic tertiary amine compound and styrylamine compound, a butadiene compound, a polystyrene derivative, a hydrazone derivative, a triphenylmethane derivative, or a tetraphenylbenzene derivative, as disclosed in Japanese Patent Application Publication No. 5-163488. In particular, a porphyrin compound, as well as an aromatic tertiary amine compound and styrylamine compound, are preferable.

<Organic Light-Emitting Layer>

The organic light-emitting layers 6b, 6g, and 6r are formed from a fluorescent material such as, for example, an oxinoid compound, perylene compound, coumarin compound, azacoumarin compound, oxazole compound, oxadiazole compound, perinone compound, pyrrolo-pyrrole compound, naphthalene compound, anthracene compound, fluorene compound, fluoranthene compound, tetracene compound, pyrene compound, coronene compound, quinolone compound and azaquinolone compound, pyrazoline derivative and pyrazolone derivative, rhodamine compound, chrysene compound, phenanthrene compound, cyclopentadiene compound, stilbene compound, diphenylquinone compound, styryl compound, butadiene compound, dicyanomethylene pyran compound, dicyanomethylene thiopyran compound, fluorescein compound, pyrylium compound, thiapyrylium compound, selenapyrylium compound, telluropyrylium compound, aromatic aldadiene compound, oligophenylene compound, thioxanthene compound, anthracene compound, cyanine compound, acridine compound, metal complex of a 8-hydroxyquinoline compound, metal complex of a 2-bipyridine compound, complex of a Schiff base and a group three metal, metal complex of oxine, rare earth metal complex, and the like, as recited in Japanese Patent Application Publication No. H5-163488.

<Electron Transport Layer>

Examples of the material for the electron transport layer 7 include a nitro-substituted fluorenone derivative, a thiopyran dioxide derivative, a diphenylquinone derivative, a perylene tetracarboxyl derivative, an anthraquinodimethane derivative, a fluoronylidene methane derivative, an anthrone derivative, an oxadiazole derivative, a perinone derivative, and a quinolone complex derivative, as recited in Japanese Patent Application Publication No. H5-163488.

Note that from the perspective of further improving electron injection characteristics, the above materials for forming the electron transport layer may be doped with an alkali metal or an alkaline-earth metal, such as Na, Ba, or Ca.

<Transparent Cathode>

The transparent cathode 8 functions as a negative electrode for the organic light-emitting element. The material for the transparent cathode 8 should be formed from a conductive material sufficiently translucent with respect to light emitted by the organic light-emitting layers 6b, 6g, and 6r. For example, the transparent cathode 8 is preferably formed from ITO or IZO.

<Thin-Film Passivation Layer>

The thin-film passivation layer 9 has the function of preventing the layers interposed between the substrate 1 and the thin-film passivation layer 9 from being exposed to moisture or air. The material for the thin-film passivation layer 9 is, for example, silicon nitride (SiN), silicon oxynitride (SiON), resin, or the like.

<Resin Passivation Layer>

The resin passivation layer 10 has the functions of adhering the back panel, which is composed of the layers from the substrate 1 to the thin-film passivation layer 9, to the substrate 11, on which are formed the color filters 13b, 13g, and 13r, and of preventing the layers from being exposed to moisture or air. The material for the resin passivation layer 10 is, for example, a resin adhesive or the like.

<Color Filters>

The color filters 13b, 13g, and 13r have the function of correcting the chromaticity of light emitted by the organic light-emitting elements.

[Organic Display Device]

Figure 16:
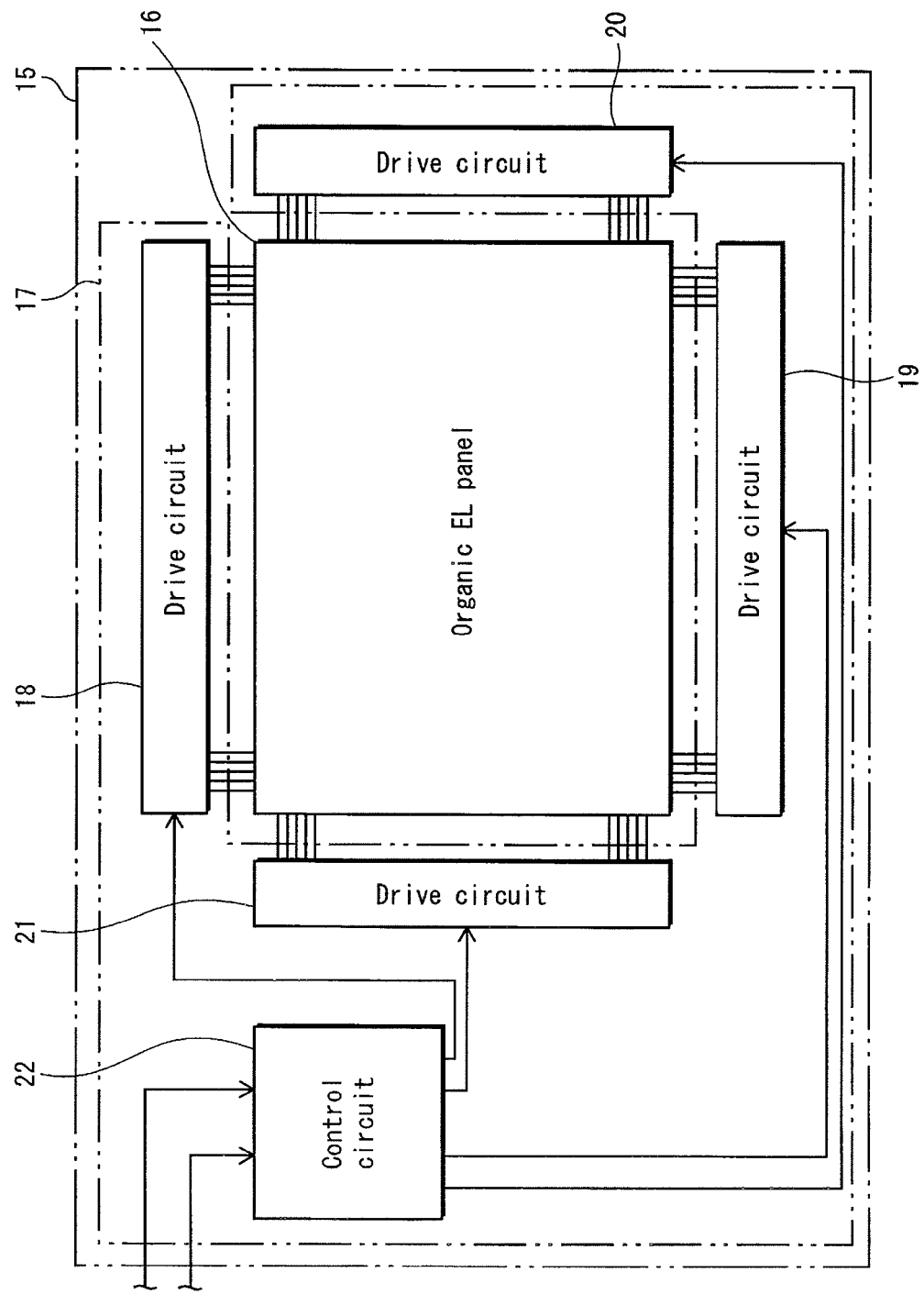
FIG. 16 shows a functional block for an organic display device according to an embodiment of the present invention.
Figure 17:
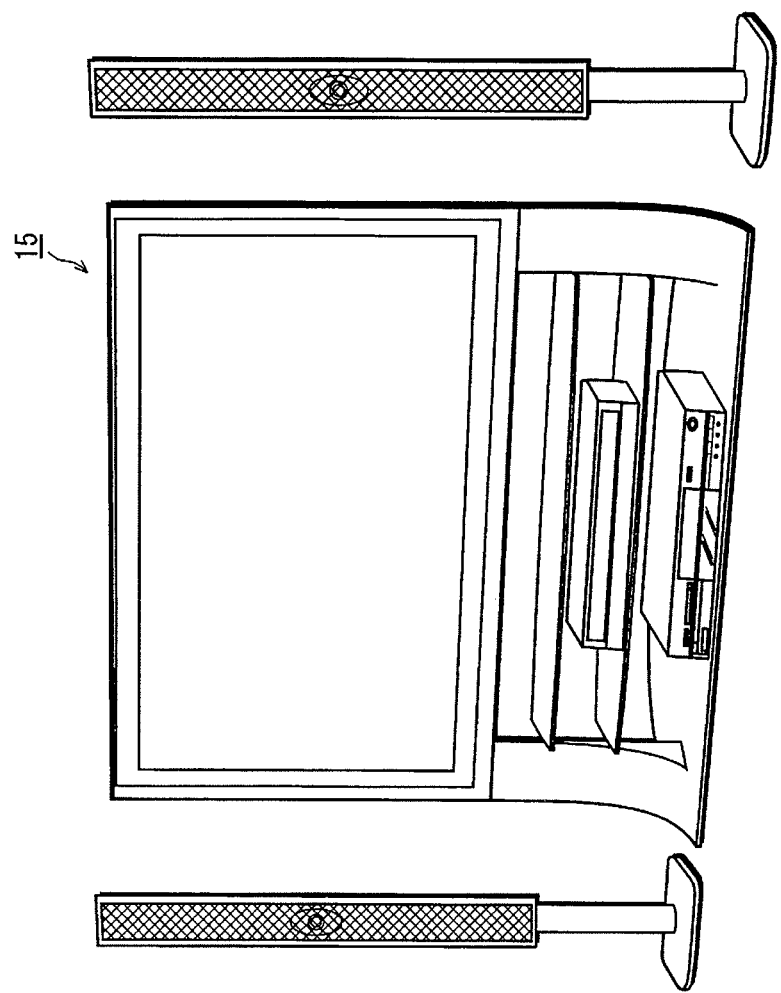
FIG. 17 shows an external view of an organic display device according to an embodiment of the present invention.

FIG. 16 shows a functional block for an organic display device according to an embodiment of the present invention. FIG. 17 shows an external view of an organic display device according to an embodiment of the present invention. The organic display device 15 includes an organic display panel 16 and a drive control unit 17 electrically connected thereto. The organic display panel 16 has the pixel structure shown in FIG. 15. The drive control unit 17 includes drive circuits 18-21 that apply voltage between the reflective anode 2 of each organic light-emitting element and the transparent cathode 8, and a control circuit 22 that controls operations of the drive circuits 18-21.

[Method of Manufacturing Organic Display Panel]

Next, the method of manufacturing an organic display panel is described. FIGS. 18A-18D and 19A-19C illustrate the method of manufacturing the organic display panel according to an embodiment of the present invention.

Figure 18A:
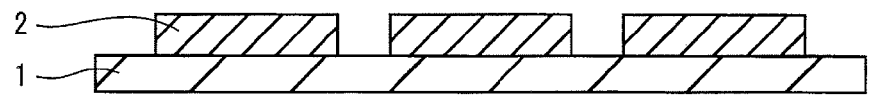
FIGS. 18A-18D illustrate a method of manufacturing the organic display panel according to an embodiment of the present invention.
Figure 18B:
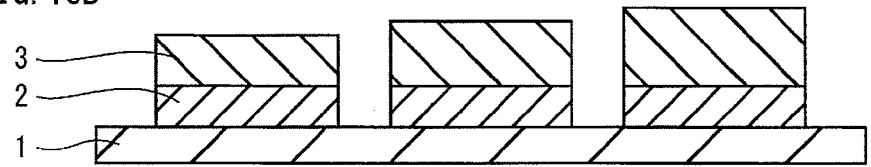

First, reflective anodes 2 are formed on a substrate 1 by vapor deposition or sputtering (FIG. 18A). Next, transparent conductive layers 3 are formed on the reflective anodes 2 by vapor deposition or sputtering (FIG. 18B). At this point, the thickness of the transparent conductive layer 3 is adjusted to be within the above-described range.

Figure 18C:
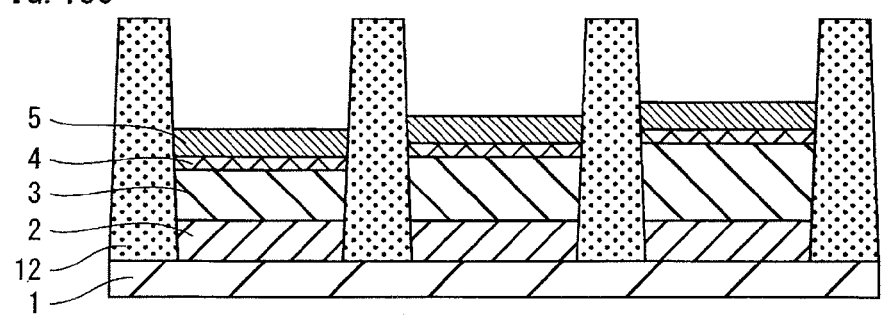

Next, on the transparent conductive layers 3, hole injection layers 4, for example, are formed by sputtering or the like, banks 12 are formed, and on the hole injection layers 4, a hole transport layers 5, for example, are formed by the inkjet method or the like (FIG. 18C).

Figure 18D:
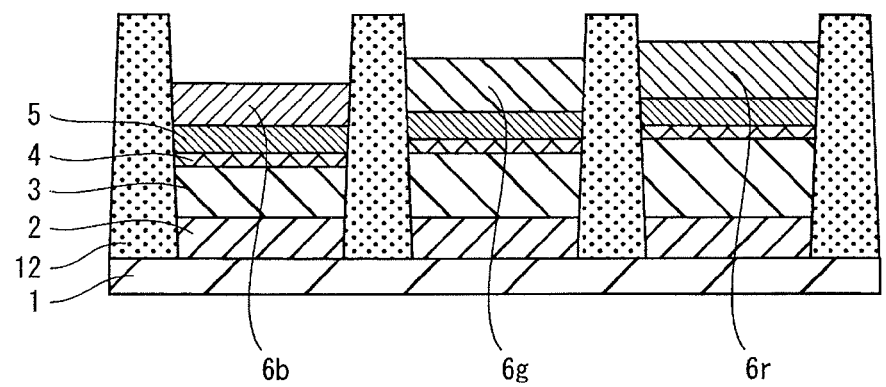

Then, on the hole transport layers 5, organic light-emitting layers 6b, 6g, and 6r are formed (FIG. 18D).

Figure 19A:
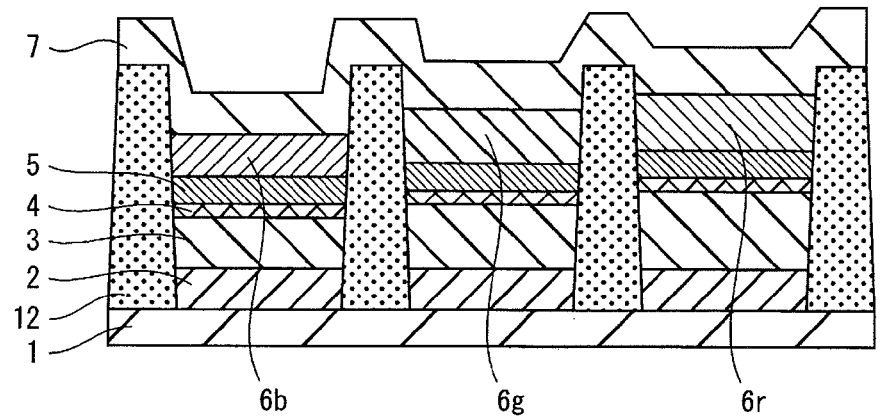
FIGS. 19A-19C illustrate the method of manufacturing the organic display panel according to an embodiment of the present invention.

Next, an electron transport layer 7 is formed on the organic light-emitting layers 6b, 6g, and 6r (FIG. 19A).

Figure 19B:
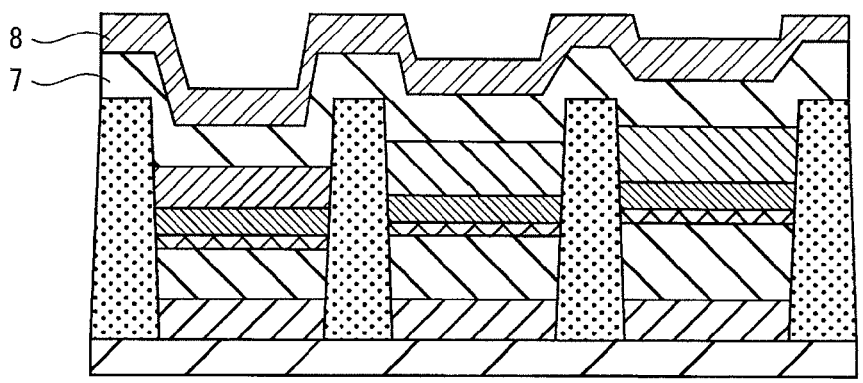

A transparent cathode 8 is then formed on the electron transport layer 7 (FIG. 19B). At this point, the thickness of the transparent cathode 8 is adjusted to be within the above-described range.

Figure 19C:
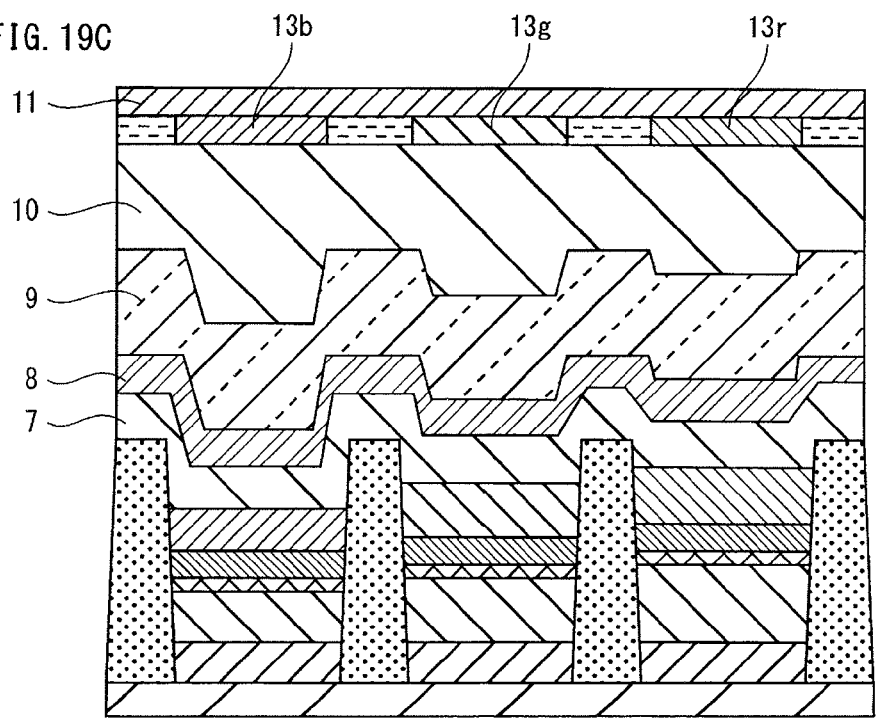

Next, a thin-film passivation layer 9 is formed on the transparent cathode 8, and a substrate 11 in which color filters 13*b*, 13*g*, and 13*r* are formed is adhered thereto using a resin passivation layer 10 (FIG. 19C).

The present invention has been described based on embodiments thereof, but the present invention is not limited to the above embodiments. For example, the following modifications are possible.

(1) In the embodiments, the first functional layer is composed of the transparent conductive layer 3, the hole injection layer 4, and the hole transport layer 5, but the present invention is not limited in this way. Any of these layers may be absent, and other functional layers may be included.

(2) In the embodiments, the second functional layer is composed of the electron transport layer 7, but the present invention is not limited in this way. For example, an electron injection layer may be included.

(3) In the simulations, preferred ranges for the refractive index, physical thickness, and optical thickness of each layer are prescribed. The numerical ranges shown in FIGS. 6 and 11 are the best among the preferred ranges. Light-extraction efficiency is increased by satisfying the numerical ranges shown in FIGS. 6 and 11.

[Industrial Applicability]

The organic light-emitting element of the present invention can be used in organic display panels such as organic EL panels, in organic display devices such as organic EL displays, in organic light-emitting devices such as organic EL lights, and the like.

The invention claimed is:

1. An organic light-emitting element, comprising:
a first electrode that reflects incident light;
a second electrode, disposed to face the first electrode, that transmits incident light;
an organic light-emitting layer, disposed between the first electrode and the second electrode, that emits blue light;
a first functional layer disposed between the first electrode and the organic light-emitting layer and composed of one or more layers; and
a second functional layer disposed between the organic light-emitting layer and the second electrode and composed of one or more layers; and
a coating layer disposed to coat the second electrode and composed of one or more layers, wherein
a portion of the blue light emitted from the organic light-emitting layer travels a first optical path by passing through the first functional layer, striking and being reflected by the first electrode, and then being emitted externally after passing through the first functional layer, the organic light-emitting layer, the second functional layer, the second electrode, and the coating layer,
a remaining portion of the blue light emitted from the organic light-emitting layer travels a second optical path by travelling through the second functional layer towards the second electrode, instead of towards the first electrode, and being emitted externally after passing through the second electrode and the coating layer,
an optical thickness of the first functional layer is at most equal to 316 nm,
a difference in refractive index between the second electrode and a layer adjacent to the second electrode among the one or more layers composing the second functional layer is from 0.1 to 0.7 inclusive,
the second electrode has a physical thickness at most equal to 70 nm, a refractive index from 2.0 to 2.4 inclusive, and an optical thickness at most equal to 168 nm, and
a difference in refractive index between the second electrode and a layer adjacent to the second electrode among the one or more layers composing the coating layer is from 0.1 to 0.7 inclusive.

2. The organic light-emitting element according to claim 1, wherein the following holds:

$$X3 = Rx \cos\theta \cos\phi - Ry \sin\theta \sin\phi + X0$$

$$Y3 = Rx \cos\theta \sin\phi + Ry \sin\theta \cos\phi + Y0$$

$$-\phi \leq \theta \leq \pi - \phi$$

$$X0=31,\ Y0=35,\ Rx=5.2,\ Ry=27,\ \phi=0.15(rad)$$

X3 being the physical thickness of the first functional layer and Y3 being the physical thickness of the second electrode.

3. The organic light-emitting element according to claim 1, wherein the following holds:

$$X3 = Rx \cos\theta \cos\phi - Ry \sin\theta \sin\phi + X0$$

$$Y3 = Rx \cos\theta \sin\phi + Ry \sin\theta \cos\phi + Y0$$

$$-\phi \leq \theta \leq \pi - \phi$$

$$X0=130,\ Y0=35,\ Rx=8,\ Ry=15,\ \phi=0.20(rad)$$

X3 being the physical thickness of the first functional layer and Y3 being the physical thickness of the second electrode.

4. The organic light-emitting element according to claim 1, wherein
a refractive index of the layer adjacent to the second electrode among the one or more layers composing the second functional layer is from 1.7 to 2.1 inclusive, and
a refractive index of the layer adjacent to the second electrode among the one or more layers composing the coating layer is from 1.7 to 2.1 inclusive.

5. The organic light-emitting element according to claim 1, wherein
the physical thickness of the second electrode is from 30 nm to 60 nm inclusive, and the optical thickness of the second electrode is from 60 nm to 144 nm inclusive.

6. The organic light-emitting element according to claim 1, wherein
the physical thickness of the second electrode is from 30 nm to 70 nm inclusive, and the optical thickness of the second electrode is from 60 nm to 168 nm inclusive.

7. The organic light-emitting element according to claim 1, wherein
the second functional layer includes an electron transport layer that transports electrons to the organic light-emitting layer,
the second electrode is a cathode, and
the coating layer includes a first passivation layer formed on the cathode and a second passivation layer formed on the first passivation layer.

8. The organic light-emitting element according to claim 7, wherein
the electron transport layer has a physical thickness from 31.5 nm to 38.5 nm inclusive and a refractive index from 1.7 to 2.1 inclusive,
the cathode has a physical thickness from 31.5 nm to 38.5 nm inclusive, a refractive index from 2.0 to 2.4 inclusive, and an optical thickness from 63 nm to 92.4 nm inclusive, the first passivation layer has a physical thickness from 558 nm to 682 nm inclusive and a refractive index from 1.7 to 2.1 inclusive, and the second passivation layer has a physical thickness from 5400 nm to 6600 nm inclusive and a refractive index from 1.3 to 1.7 inclusive.

9. The organic light-emitting element according to claim 1, wherein the first electrode is an anode, and the first functional layer includes a transparent conductive layer formed on the anode, a hole injection layer formed on the transparent conductive layer, and a hole transport layer formed on the hole injection layer.

10. The organic light-emitting element according to claim 7, wherein the first electrode is an anode, and the first functional layer includes a transparent conductive layer formed on the anode, a hole injection layer formed on the transparent conductive layer, and a hole transport layer formed on the hole injection layer.

11. The organic light-emitting element according to claim 9, wherein the transparent conductive layer has a physical thickness from 14.4 nm to 17.6 nm inclusive and a refractive index from 1.9 to 2.3 inclusive, the hole injection layer has a physical thickness from 4.5 nm to 5.5 nm inclusive and a refractive index from 1.8 to 2.2 inclusive, and the hole transport layer has a physical thickness from 9 nm to 11 nm inclusive and a refractive index from 1.5 to 1.9 inclusive.

12. The organic light-emitting element according to claim 9, wherein the transparent conductive layer has a physical thickness from 63 nm to 77 nm inclusive and a refractive index from 1.9 to 2.3 inclusive, the hole injection layer has a physical thickness from 36 nm to 44 nm inclusive and a refractive index from 1.8 to 2.2 inclusive, and the hole transport layer has a physical thickness from 18 nm to 22 nm inclusive and a refractive index from 1.5 to 1.9 inclusive.

13. The organic light-emitting element according to claim 10, wherein the transparent conductive layer has a physical thickness from 14.4 nm to 17.6 nm inclusive and a refractive index from 1.9 to 2.3 inclusive, the hole injection layer has a physical thickness from 4.5 nm to 5.5 nm inclusive and a refractive index from 1.8 to 2.2 inclusive, and the hole transport layer has a physical thickness from 9 nm to 11 nm inclusive and a refractive index from 1.5 to 1.9 inclusive.

14. The organic light-emitting element according to claim 10, wherein the transparent conductive layer has a physical thickness from 63 nm to 77 nm inclusive and a refractive index from 1.9 to 2.3 inclusive, the hole injection layer has a physical thickness from 36 nm to 44 nm inclusive and a refractive index from 1.8 to 2.2 inclusive, and the hole transport layer has a physical thickness from 18 nm to 22 nm inclusive and a refractive index from 1.5 to 1.9 inclusive.

15. The organic light-emitting element according to claim 1, wherein the optical thickness of the first functional layer is from 49.0 nm to 73.5 nm inclusive, and the optical thickness of the second electrode is from 63 nm to 92.4 nm inclusive.

16. The organic light-emitting element according to claim 1, wherein the optical thickness of the first functional layer is from 212 nm to 316 nm inclusive, and the optical thickness of the second electrode is from 63 nm to 92.4 nm inclusive.

17. An organic light-emitting device including the organic light-emitting element according to claim 1.

18. An organic display panel including the organic light-emitting element according to claim 1.

19. An organic display device including the organic light-emitting element according to claim 1.

20. A method of manufacturing an organic light-emitting element, the organic light-emitting element including:

a first electrode that reflects incident light;

a second electrode, disposed to face the first electrode, that transmits incident light;

an organic light-emitting layer, disposed between the first electrode and the second electrode, that emits blue light;

a first functional layer disposed between the first electrode and the organic light-emitting layer and composed of one or more layers; and a second functional layer disposed between the organic light-emitting layer and the second electrode and composed of one or more layers; and a coating layer disposed to coat the second electrode and composed of one or more layers, the organic light-emitting element being configured such that a portion of the blue light emitted from the organic light-emitting layer travels a first optical path by passing through the first functional layer, striking and being reflected by the first electrode, and then being emitted externally after passing through the first functional layer, the organic light-emitting layer, the second functional layer, the second electrode, and the coating layer, the organic light-emitting element being further configured such that a remaining portion of the blue light emitted from the organic light-emitting layer travels a second optical path by travelling through the second functional layer towards the second electrode, instead of towards the first electrode, and being emitted externally after passing through the second electrode and the coating layer, the method of manufacturing the organic light-emitting element comprising:

preparing the first electrode that reflects the incident light;

forming, on the first electrode, the first functional layer composed of the one or more layers;

forming, on the first functional layer, the organic light-emitting layer that emits the blue light;

forming, on the organic light-emitting layer, the second functional layer composed of the one or more layers that differ from the first functional layer;

forming, on the second functional layer, the second electrode that transmits the incident light; and coating the second electrode with the coating layer composed of the one or more layers, wherein the first functional layer is formed to have an optical thickness at most equal to 316 nm, material used to form the second functional layer is such that a difference in refractive index between the second electrode and a layer adjacent to the second electrode among the one or more layers composing the second functional layer is from 0.1 to 0.7 inclusive, the second electrode is formed to have a physical thickness at most equal to 70 nm, a refractive index from 2.0 to 2.4 inclusive, and an optical thickness at most equal to 168 nm, and material used to form the coating layer is such that a difference in refractive index between the second electrode and a layer adjacent to the second electrode among the one or more layers composing the coating layer is from 0.1 to 0.7 inclusive.

21. The method of manufacturing an organic light-emitting element of claim 20, wherein the first functional layer and the second electrode are formed so that the following holds:

$$X3 = Rx \cos\theta \cos\phi - Ry \sin\theta \sin\phi + X0$$

$$Y3 = Rx \cos\theta \sin\phi + Ry \sin\theta \cos\phi + Y0$$

$$-\phi \leq \theta \leq \pi - \phi$$

$$X0=31, Y0=35, Rx=5.2, Ry=27, \phi=0.15(rad)$$

X3 being the physical thickness of the first functional layer and Y3 being the physical thickness of the second electrode.

22. The method of manufacturing an organic light-emitting element of claim 20, wherein the first functional layer and the second electrode are formed so that the following holds:

$$X3 = Rx \cos\theta \cos\phi - Ry \sin\theta \sin\phi + X0$$

$$Y3 = Rx \cos\theta \sin\phi + Ry \sin\theta \cos\phi + Y0$$

$$-\phi \leq \theta \leq \pi - \phi$$

$$X0=130, Y0=35, Rx=8, Ry=15, \phi=0.20(rad)$$

X3 being the physical thickness of the first functional layer and Y3 being the physical thickness of the second electrode.

23. The method of manufacturing an organic light-emitting element of claim 20, wherein material having a refractive index from 1.7 to 2.1 inclusive is used to form the layer adjacent to the second electrode among the one or more layers composing the second functional layer, and material used to form the coating layer is such that a refractive index of the layer adjacent to the second electrode among the one or more layers composing the coating layer is from 1.7 to 2.1 inclusive.

24. The method of manufacturing an organic light-emitting element of claim 20, wherein an anode is formed as the first electrode, as the first functional layer, a transparent conductive layer is formed on the anode, a hole injection layer is formed on the transparent conductive layer, and a hole transport layer is formed on the hole injection layer, the transparent conductive layer is formed from material having a refractive index from 1.9 to 2.3 inclusive and is formed to have a physical thickness from 14.4 nm to 17.6 nm inclusive, the hole injection layer is formed from material having a refractive index from 1.8 to 2.2 inclusive and is formed to have a physical thickness from 4.5 nm to 5.5 nm inclusive, the hole transport layer is formed from material having a refractive index from 1.5 to 1.9 inclusive and is formed to have a physical thickness from 9 nm to 11 nm inclusive, the organic light-emitting layer is formed from material having a refractive index from 1.6 to 2.0 inclusive and is formed to have a physical thickness from 36 nm to 44 nm inclusive, as the second functional layer, an electron transport layer that transports electrons to the organic light-emitting layer is formed from material having a refractive index from 1.7 to 2.1 inclusive and is formed to have a physical thickness from 31.5 nm to 38.5 nm inclusive, as the second electrode, a cathode is formed on the electron transport layer from material having a refractive index from 2.0 to 2.4 inclusive, is formed to have a physical thickness from 31.5 nm to 38.5 nm inclusive, and is formed to have an optical thickness from 63 nm to 92.4 nm inclusive, as the coating layer, a first passivation layer is formed on the cathode and a second passivation layer is formed on the first passivation layer, the first passivation layer is formed from material having a refractive index from 1.7 to 2.1 inclusive and is formed to have a physical thickness from 558 nm to 682 nm inclusive, and the second passivation layer is formed from material having a refractive index from 1.3 to 1.7 inclusive and is formed to have a physical thickness from 5400 nm to 6600 nm inclusive.

25. The method of manufacturing an organic light-emitting element of claim 20, wherein an anode is formed as the first electrode, as the first functional layer, a transparent conductive layer is formed on the anode, a hole injection layer is formed on the transparent conductive layer, and a hole transport layer is formed on the hole injection layer, the transparent conductive layer is formed from material having a refractive index from 1.9 to 2.3 inclusive and is formed to have a physical thickness from 63 nm to 77 nm inclusive, the hole injection layer is formed from material having a refractive index from 1.8 to 2.2 inclusive and is formed to have a physical thickness from 36 nm to 44 nm inclusive, the hole transport layer is formed from material having a refractive index from 1.5 to 1.9 inclusive and is formed to have a physical thickness from 18 nm to 22 nm inclusive, the organic light-emitting layer is formed from material having a refractive index from 1.6 to 2.0 inclusive and is formed to have a physical thickness from 36 nm to 44 nm inclusive, as the second functional layer, an electron transport layer that transports electrons to the organic light-emitting layer is formed from material having a refractive index from 1.7 to 2.1 inclusive and is formed to have a physical thickness from 31.5 nm to 38.5 nm inclusive, as the second electrode, a cathode is formed on the electron transport layer from material having a refractive index from 2.0 to 2.4 inclusive, is formed to have a physical thickness from 31.5 nm to 38.5 nm inclusive, and is formed to have an optical thickness from 63 nm to 92.4 nm inclusive, as the coating layer, a first passivation layer is formed on the cathode and a second passivation layer is formed on the first passivation layer, the first passivation layer is formed from material having a refractive index from 1.7 to 2.1 inclusive and is formed to have a physical thickness from 558 nm to 682 nm inclusive, and the second passivation layer is formed from material having a refractive index from 1.3 to 1.7 inclusive and is formed to have a physical thickness from 5400 nm to 6600 nm inclusive.

26. The organic light-emitting element according to claim 1, the portion of blue light emitted from the organic light-emitting layer along the first optical path and the remaining portion of the blue light emitted from the organic light-emitting layer along the second optical path strengthen each other through an interference effect.

27. The organic light-emitting element according to claim 1, wherein a portion of the blue light emitted from the second electrode, which travels a third optical path by being directly emitted through the second electrode, and a remaining portion of the blue light emitted from the second electrode, which travels a fourth optical path by being emitted after multiple reflections in the second electrode at the boundary surfaces with the second functional layer and with the coating layer, strengthen each other through an interference effect.

28. The method of manufacturing an organic light-emitting element of claim 20, the portion of blue light emitted from the organic light-emitting layer along the first optical path and the remaining portion of the blue light emitted from the organic light-emitting layer along the second optical path strengthen each other through an interference effect.

29. The method of manufacturing an organic light-emitting element of claim 20, wherein the organic light-emitting element is further configured such that a portion of the blue light emitted from the second electrode, which travels a third optical path by being directly emitted through the second electrode, and a remaining portion of the blue light emitted from the second electrode, which travels a fourth optical path by being emitted after multiple reflections in the second electrode at the boundary surfaces with the second functional layer and with the coating layer, strengthen each other through an interference effect.

* * * * *